US009564463B2

United States Patent
Ihara

(10) Patent No.: US 9,564,463 B2
(45) Date of Patent: Feb. 7, 2017

(54) METHODS OF FABRICATING IMAGE SENSORS HAVING DEEP TRENCHES INCLUDING NEGATIVE CHARGE MATERIAL

(71) Applicant: Hisanori Ihara, Seongnam-si (KR)

(72) Inventor: Hisanori Ihara, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/053,356

(22) Filed: Feb. 25, 2016

(65) Prior Publication Data

US 2016/0172391 A1    Jun. 16, 2016

Related U.S. Application Data

(63) Continuation of application No. 14/624,751, filed on Feb. 18, 2015, now Pat. No. 9,305,947.

(30) Foreign Application Priority Data

Feb. 27, 2014 (KR) .................. 10-2014-0023278

(51) Int. Cl.
*H01L 21/00* (2006.01)
*H01L 27/146* (2006.01)

(52) U.S. Cl.
CPC ....... *H01L 27/1463* (2013.01); *H01L 27/1464* (2013.01); *H01L 27/14605* (2013.01);
(Continued)

(58) Field of Classification Search
CPC .............. H01L 27/14623; H01L 27/14685; H01L 27/14627; H01L 27/1463; H01L 27/1464; H01L 27/14643
See application file for complete search history.

(56) References Cited

U.S. PATENT DOCUMENTS

| 5,691,232 A | 11/1997 | Bashir et al. |
| 5,970,333 A | 10/1999 | Gris et al. |

(Continued)

FOREIGN PATENT DOCUMENTS

| JP | 10-200004 | 7/1998 |
| JP | 2007-081358 | 3/2007 |

(Continued)

*Primary Examiner* — Hoai V Pham
(74) *Attorney, Agent, or Firm* — Myers Bigel, P.A.

(57) ABSTRACT

Image sensors are provided including a substrate defining a plurality of pixel regions, the substrate having a first surface and a second surface opposite the first surface. The second surface of the substrate is configured to receive light incident thereon and the substrate defines a deep trench extending from the second surface of the substrate toward the first surface substrate and separating the plurality of pixel regions from each other. In each of the plurality of pixel regions of the substrate, a photoelectric conversion region is provided. A gate electrode is provided on the photoelectric conversion region and a negative fixed charge layer covering the second surface of the substrate and at least a portion of a sidewall of the deep trench is also provided. The image sensors further include a shallow device isolation layer on the first surface of the substrate. The shallow device isolation layer defines an active region in each of the pixel regions and the negative fixed charge layer contacts the shallow device isolation layer.

21 Claims, 31 Drawing Sheets

(52) U.S. Cl.
CPC .. *H01L 27/14614* (2013.01); *H01L 27/14621* (2013.01); *H01L 27/14627* (2013.01); *H01L 27/14638* (2013.01); *H01L 27/14685* (2013.01); *H01L 27/14687* (2013.01); *H01L 27/14689* (2013.01)

(56) References Cited

U.S. PATENT DOCUMENTS

| | | |
|---|---|---|
| 6,121,148 A | 9/2000 | Bashir et al. |
| 7,405,437 B2 | 7/2008 | Shim et al. |
| 7,608,872 B2 | 10/2009 | Kim |
| 8,637,910 B2 | 1/2014 | Koo et al. |
| 8,658,956 B2 | 2/2014 | Venezia et al. |
| 8,691,660 B2 | 4/2014 | Schuler et al. |
| 8,710,621 B2 | 4/2014 | Tanaka et al. |
| 8,716,769 B2 | 5/2014 | Ihara et al. |
| 2013/0193496 A1 | 8/2013 | Hisanori |
| 2015/0311238 A1 | 10/2015 | Kim .................. H01L 27/1463 257/432 |
| 2016/0043120 A1* | 2/2016 | Ahn .................. H01L 27/1463 257/229 |

FOREIGN PATENT DOCUMENTS

| | | |
|---|---|---|
| JP | 2007-165591 | 6/2007 |
| JP | 2013-098446 | 5/2013 |
| KR | 10-0670606 | 1/2007 |
| WO | WO 2013/065569 A1 | 5/2013 |

\* cited by examiner

METHODS OF FABRICATING IMAGE SENSORS HAVING DEEP TRENCHES INCLUDING NEGATIVE CHARGE MATERIAL

CROSS-REFERENCE TO RELATED APPLICATIONS

This application is a continuation of U.S. patent application Ser. No. 14/624,751, filed Feb. 18, 2015, which claims priority to Korean Patent Application 10-2014-0023278, filed Feb. 27, 2014, the entire content of which are hereby incorporated herein by reference in their entireties.

FIELD

The present inventive concept relates generally to image sensors and, more particularly, to image sensors and methods of fabricating image sensors.

BACKGROUND

Image sensors are semiconductor devices capable of converting electric signals into optical images. Image sensors may be classified into various types, including charge coupled device (CCD) type and complementary metal oxide semiconductor (CMOS) type. A CMOS type image sensor, i.e., referred to as CIS, may include pixels arranged in two dimensions. Each of the pixels may include a photodiode (PD), which converts incident light into an electric signal.

As semiconductor devices become more highly integrated, image sensors may likewise become highly integrated. Accordingly, the corresponding pixels may be scaled down, such that cross talk may frequently occur between pixels.

SUMMARY

Some embodiments of the present inventive concept provide image sensors including a substrate defining a plurality of pixel regions, the substrate having a first surface and a second surface opposite the first surface. The second surface of the substrate is configured to receive light incident thereon and the substrate defines a deep trench extending from the second surface of the substrate toward the first surface substrate and separating the plurality of pixel regions from each other. In each of the plurality of pixel regions of the substrate, a photoelectric conversion region is provided. A gate electrode is provided on the photoelectric conversion region and a negative fixed charge layer covering the second surface of the substrate and at least a portion of a sidewall of the deep trench is also provided. The image sensors further include a shallow device isolation layer on the first surface of the substrate. The shallow device isolation layer defines an active region in each of the pixel regions and the negative fixed charge layer contacts the shallow device isolation layer.

In further embodiments, the negative fixed charge layer may include a metal oxide layer including one or more of hafnium (Hf), zirconium (Zr), aluminum (Al), tantalum (Ta), titanium (Ti), yttrium (Y), and lanthanide.

In still further embodiments, the negative fixed charge layer may include a metal oxide layer including of Hafnium (Hf).

In some embodiments, the gate electrode may extend toward the first surface of the substrate.

In further embodiments, the negative fixed charge layer may include a bottom surface spaced apart from at least one of top and bottom surfaces of the shallow device isolation layer. In certain embodiments, the bottom surface and a lower sidewall of the negative fixed charge layer may contact the shallow device isolation layer.

In still further embodiments, the negative fixed charge layer may extend inside the shallow device isolation layer.

In some embodiments, a filling insulation layer may contact the negative fixed charge layer in the deep trench and extend toward the second surface of the substrate.

In further embodiments, an air-gap region may be provided in the deep trench.

In still further embodiments, a polysilicon pattern may be provided in the deep trench and the negative fixed charge layer may contact the polysilicon pattern.

In some embodiments, a channel stop layer may be provided adjacent to the first surface of the substrate and may define an active region in each of the pixel regions. An inter-dielectric layer may cover the first surface of the substrate and the negative fixed charge layer may contact the inter-dielectric layer.

In further embodiments, a channel stop layer may be provided adjacent to the first surface of the substrate and may define an active region in each of the pixel regions. An inter-dielectric layer may cover the first surface of the substrate. An etch stop layer may be provided between the first surface and the inter-dielectric layer and the negative fixed charge layer may contact the etch stop layer.

In still further embodiments, a polysilicon pattern may be provided under the deep trench. An insulation liner pattern may fill a space between the polysilicon and a lower sidewall of the deep trench. The negative fixed charge layer may contact top surfaces of the polysilicon pattern and the insulation liner pattern.

In some embodiments, the image sensor may further include an impurity doped region on the substrate adjacent to the sidewall of the deep trench.

In further embodiments, the deep trench may include a bottom surface in the shallow device isolation layer, the bottom surface of the deep trench having a crooked shape. In certain embodiments, the negative fixed charge layer may cover a sidewall and the bottom surface of the deep trench. The image sensor may further include a filling insulation layer filling the deep trench, the filling insulation layer having a reverse Y shape in the deep trench.

Still further embodiments of the present inventive concept provide methods of fabricating an image sensor including providing a substrate defining a plurality of pixel regions and having a first surface and a second surface, opposite the first surface, the second surface being configured to receive light incident thereon. The method further includes forming a preliminary deep device isolation layer in the substrate to define the plurality of pixel regions. In each of the pixel regions of the substrate, a photoelectric conversion layer is formed. A transistor and a line layer are formed on the first surface of the substrate. The preliminary deep device isolation layer is exposed at the second surface of the substrate. At least a portion of the preliminary deep device isolation layer is removed to form a deep trench in the substrate. A negative fixed charge layer is formed to cover the second surface and a sidewall of the deep trench.

In some embodiments, after the forming of the negative fixed charge layer, a filling insulation layer may be formed on the second surface of the substrate.

In further embodiments, forming the filling insulation layer may further include forming the filling insulation layer extending inside of the deep trench to fill the deep trench.

In still further embodiments, forming the filling insulation layer may include forming the filling insulation layer at a temperature substantially similar to or less than a temperature used for forming the negative fixed charge layer.

In some embodiments, after the forming of the negative fixed charge layer, an air-gap region may be formed in the deep trench.

BRIEF DESCRIPTION OF THE DRAWINGS

The foregoing and other features and advantages of example embodiments of inventive concept will be apparent from the more particular description of non-limiting embodiments of the inventive concept, as illustrated in the accompanying drawings in which like reference characters refer to the same parts throughout the different views. The drawings are not necessarily to scale, emphasis instead being placed upon illustrating the principles of the inventive concept. In the drawings.

DETAILED DESCRIPTION

Figure 1:
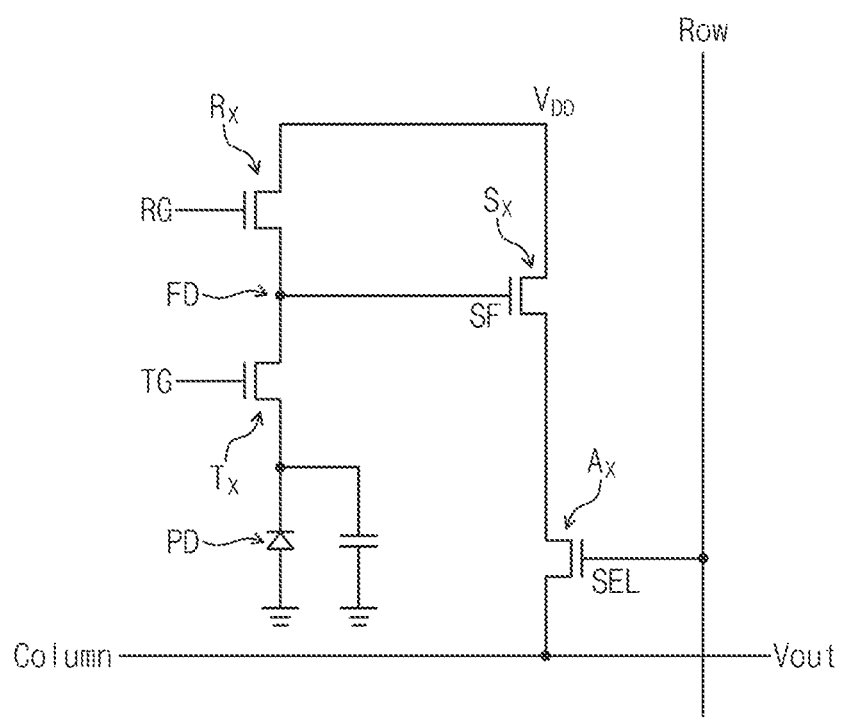
FIG. 1 is a circuit diagram of an image sensor according to some embodiments of the present inventive concept.

Various some embodiments will be described more fully hereinafter with reference to the accompanying drawings, in which some embodiments are shown. The present inventive concept may, however, be embodied in many different forms and should not be construed as limited to the some embodiments set forth herein. Rather, these some embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular some embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Some embodiments are described herein with reference to cross-sectional illustrations that are schematic illustrations of idealized some embodiments (and intermediate structures). As such, variations from the shapes of the illustrations as a result, for example, of manufacturing techniques and/or tolerances, are to be expected. Thus, some embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Referring first to FIG. 1, a circuit diagram of an image sensor according to some embodiments of the present inventive concept will be discussed. As illustrated in FIG. 1, an image sensor may include a plurality of unit pixels, each of which includes a photoelectric conversion region PD, a transfer transistor Tx, a source follower transistor Sx, a reset transistor Rx, and a selection transistor Ax. The transfer transistor Tx, the source follower transistor Sx, the reset transistor Rx, and the selection transistor Ax may include a transfer gate TG, a source follower gate SF, a reset gate RG, and a selection gate SEL, respectively. A photoelectric conversion portion may be provided in the photoelectric conversion region PD. The photoelectric conversion portion may be a photodiode including an n-type impurity region and a p-type impurity region. The transfer transistor Tx may include a drain region serving as a floating diffusion region FD. The floating diffusion region FD may also serve as a source region of the reset transistor Rx. The floating diffusion region FD may be electrically connected to the source follower gate SF of the source follower transistor Sx. The source follower transistor Sx may be coupled to the selection transistor Ax. The reset transistor Rx, the source follower transistor Sx, and the selection transistor Ax may be shared by adjacent pixels and, thus, make it possible to increase an integration density of the image sensor.

Hereinafter, operations of the image sensor will be discussed with reference to FIG. 1. When in a light-blocked state, a power voltage $V_{DD}$ may be applied to a drain region of the reset transistor Rx and a drain region of the source follower transistor Sx to discharge electric charges from the floating diffusion region FD. Thereafter, if the reset transistor Rx is turned off and external light is incident into the photoelectric conversion region PD, electron-hole pairs may be generated in the photoelectric conversion region PD. Holes may be moved toward the p-type doped region, and electrons may be moved toward and accumulated in the n-type doped region. If the transfer transistor Tx is turned on, the electric charges, for example, electrons, may be transferred to and accumulated in the floating diffusion region FD. A gate bias of the source follower transistor Sx may be changed in proportion to the amount of the accumulated charges in the floating diffusion region FD, and this may lead to a change in source potential of the source follower transistor Sx. At this time, if the selection transistor Ax is turned on, an amount of the electrons may be read out as a signal to be transmitted through a column line.

Figure 2:
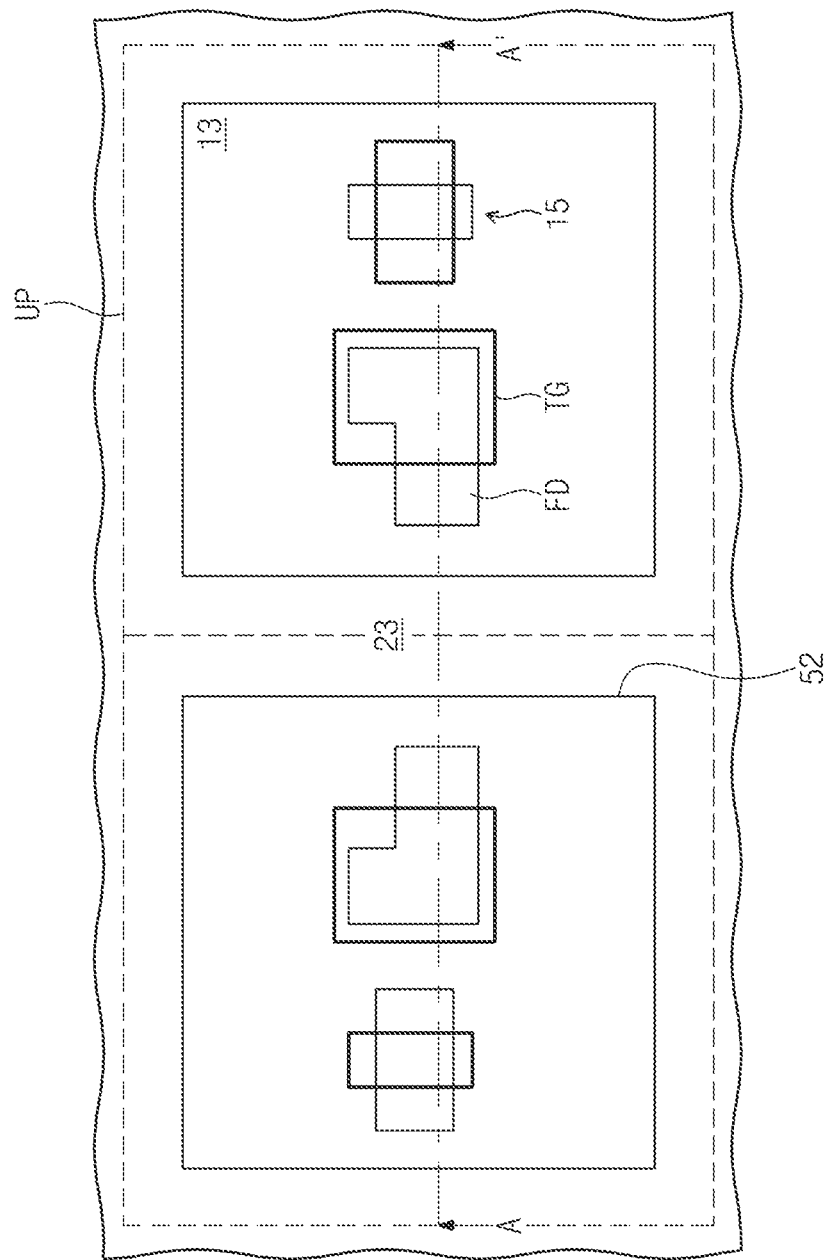
FIG. 2 is a layout of an image sensor according to some embodiments of the present inventive concept
Figure 3:
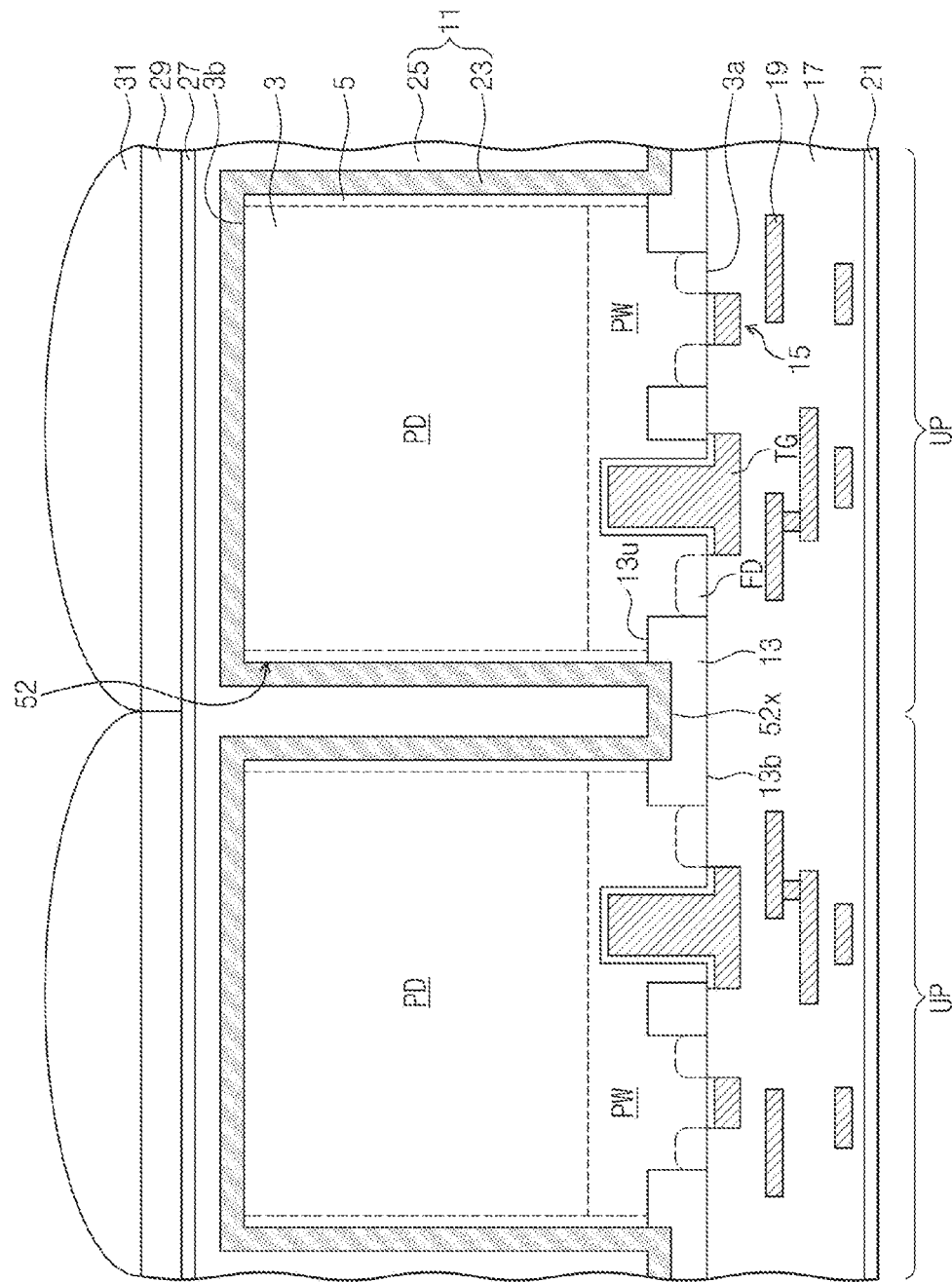
FIG. 3 is a cross section taken along a line A-A' of FIG. 2.

FIG. 2 is a layout of an image sensor according to some embodiments of the present inventive concept. FIG. 3 is a cross section taken along a line A-A' of FIG. 2. As illustrated in FIGS. 2 and 3, a substrate 3 may be provided to include a plurality of unit pixel regions UP. The substrate 3 may be a silicon wafer, a silicon on insulator (SOI) substrate, or a semiconductor epitaxial layer without departing from the scope of the present inventive concept. The substrate 3 may include a front surface 3a and a backside surface 3b facing each other. Light may be incident to the backside surface 3b. A plurality of circuits may be disposed on the front surface 3a. The unit pixel regions UP may be separated from each other by a backside deep trench 52. The backside deep trench 52 may partially penetrate the substrate 3 from the backside surface 3b toward the front surface 3a. In plan view, in some embodiments the backside deep trench 52 may be formed to have a shape like a mesh or grid. The photoelectric conversion region PD may be on the substrate 3 in each of the unit pixel regions UP separated from each other by the backside deep trench 52. The photoelectric conversion region PD may be disposed to be adjacent to the backside surface 3b. A well region PW may be placed under the photoelectric conversion region PD and adjacent to the front surface 3a. The well region PW may be doped with impurities having a different conductivity type from that of the photoelectric conversion region PD. For example, the photoelectric conversion region PD may be doped with n-type impurities. The well region PW may be doped with p-type impurities.

A shallow device isolation layer 13 may be disposed in the front surface 3a to define an active region in each of the unit pixel regions UP. At the front surface 3a, the transfer gate TG and the floating diffusion region FD may be disposed on an active region where the shallow device isolation layer 13 is not formed. The transfer gate TG may have a vertical shape which includes an extension part partially extending inside of the substrate 3. In other words, the transfer gate TG may have a flat shape which is disposed only on the front surface 3a. A transistor 15 may be disposed on the active region at a position spaced apart from the transfer gate TG. The transistor 15 may correspond to at least one of the source follower transistor Sx, the reset transistor Rx, and the selection transistor Ax of FIG. 1. An inter-dielectric layer 17 and multi-layered lines 19 may be disposed on the front surface 3a. The inter-dielectric layer 17 may be covered by a first passivation layer 21.

A bottom surface 52x of the backside deep trench 52 may be spaced apart from a top surface 13u and a bottom surface 13b of the shallow device isolation layer 13. Sidewalls and the bottom surface 52x of the backside deep trench 52 may be conformally covered by a negative fixed charge layer 23. The negative fixed charge layer 23 may penetrate the substrate 3 to extend inside of the shallow device isolation layer 13 from the backside surface 3b. A bottom surface and lower sidewalls of the negative fixed charge layer 23 may contact the shallow device isolation layer 13. The negative fixed charge layer 23 may extend to cover the backside surface 3b. The negative fixed charge layer 23 may be a metal oxide layer containing oxygen whose amount is less than the stoichiometric ratio. Therefore, the negative fixed charge layer 23 may have negatively fixed charges. The negative fixed charge layer 23 may be a metal oxide layer including at least one of hafnium (Hf), zirconium (Zr), aluminum (Al), tantalum (Ta), titanium (Ti), yttrium (Y), and lanthanide.

The negative fixed charge layer 23 may be disposed to surround the photoelectric conversion region PD. As the negative fixed charge layer 23 has the negatively fixed charges, a hole accumulation may occur around a surface of the substrate 3 contacting the negative fixed charge layer 23. As such, electrons generated under the dark state, i.e., dark current, may move into holes to combine therewith such that a likelihood of a dark current may be reduced. Consequently, this may reduce the likelihood of the occurrence of a white spot.

An impurity doped region 5 may be disposed on the substrate 3 adjacent to sidewalls of the backside deep trench 52. The impurity doped region 5 may be doped with impurities having a different conductivity type from that of the photoelectric conversion region PD. The impurity doped region 5 may be doped to have the same conductivity type as the well region PW and a higher doping concentration than the well region PW. The backside deep trench 52 may be filled with a filling insulation layer 25. The filling insulation layer 25 may extend to cover the backside surface 3b of the substrate 3. The filling insulation layer 25 may be formed of a silicon oxide based material. The negative fixed charge layer 23 and the filling insulation layer 25 within the backside deep trench 52 may constitute a deep device isolation layer 11 and separate the unit pixel regions UP from each other. For improving the light sensitivity, the deep device isolation layer 11 may have a depth of, for example, 2.0 µm or above. In some embodiments, the deep device isolation layer may have a depth of 3.0 µm or above.

The filling insulation layer 25 may be covered by a second passivation layer 27. Each of the first and second passivation layers 21 and 27 may include at least one of silicon nitride layer and polyimide. In each of the unit pixel regions UP, a color filter 29 and a micro-lens 31 may be sequentially stacked on the second passivation layer 27. The color filter 29 may be a portion of a color filter array arranged in the form of matrix. In some embodiments, the color filter array may be provided to form the Bayer pattern including a red filter, a green filter, and a blue filter. In other embodiments, the color filter array may be configured to include a yellow filter, a magenta filter, and a cyan filter. In certain embodiments, the color filter array may further include a white filter.

Figure 4:
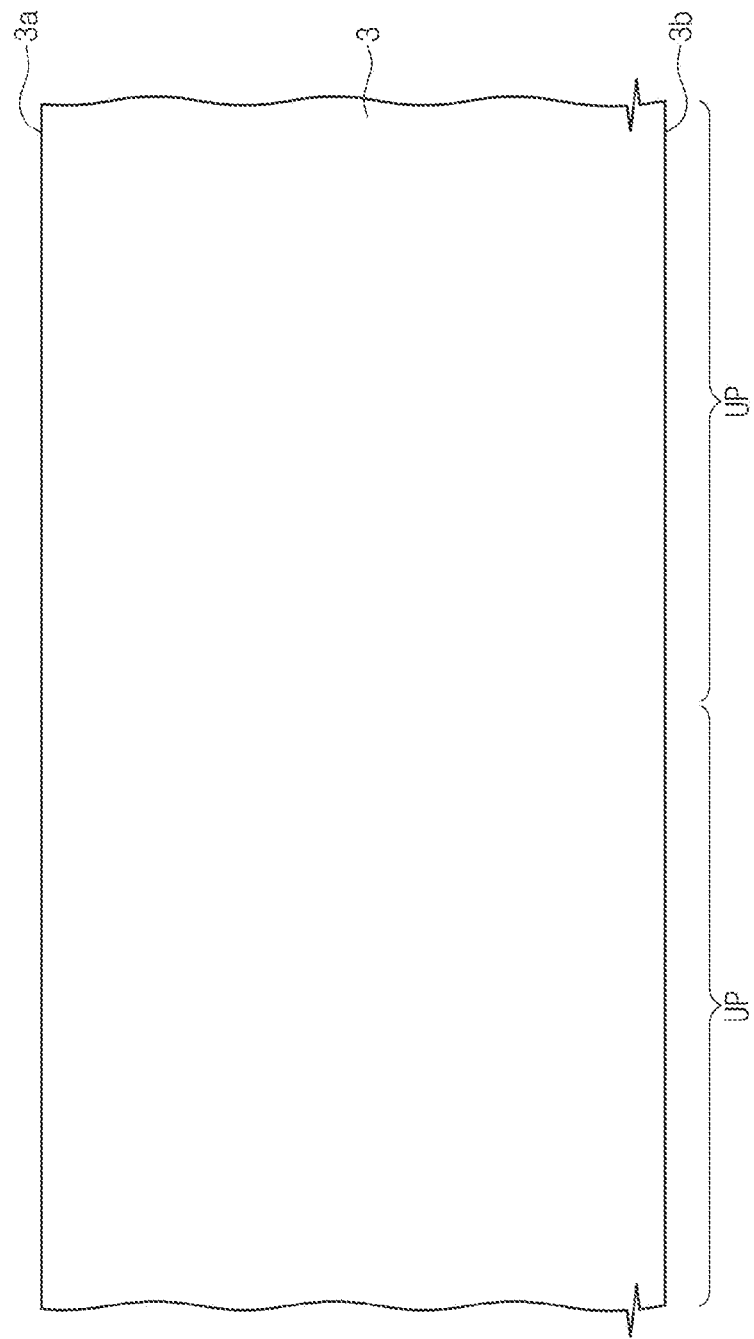
FIGS. 4 to 14 are cross sections illustrating processing steps in the fabrication of the image sensor of FIG. 3 in accordance with some embodiments of the present inventive concept.

FIGS. 4 to 14 are cross sections illustrating processing steps in the fabrication of the image sensor of FIG. 3 in accordance with some embodiments. Referring first to FIG. 4, the substrate 3 may be provided to include the plurality of unit pixel regions UP. The substrate 3 may include the front surface 3a and the backside surface 3b facing each other. The substrate 3 may be a semiconductor wafer or a semiconductor epitaxial layer.

Figure 5:
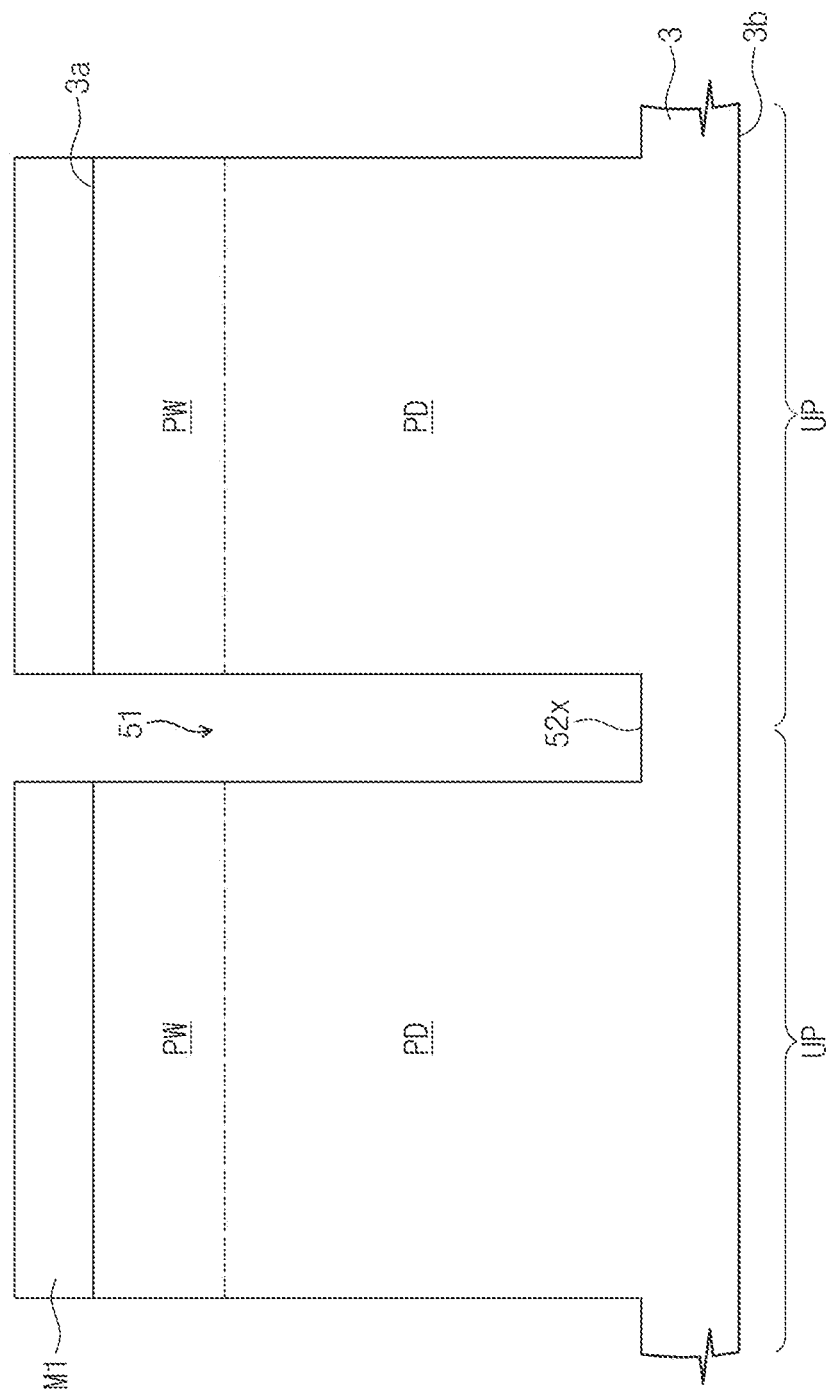

As illustrated in FIG. 5, an ion implantation process may be performed on the substrate 3 so as to form the photoelectric conversion region PD and the well region PW in each of the pixel regions UP. The photoelectric conversion region PD may be doped with, for example, n-type impurities. The well region PW may be doped with, for example, p-type impurities. However, it will be understood that embodiments of the present inventive concept are not limited to this configuration.

A first mask pattern M1 may be formed on the substrate 3 to cover each of the unit pixel regions UP. The substrate 3 may be etched using the first mask pattern M1 as an etch mask to form a front deep trench 51. The front deep trench 51 may be formed between adjacent unit pixel regions UP to separate the unit pixel regions UP from each other. The front deep trench 51 may include the bottom surface 52x spaced apart from the backside surface 3b of the substrate 3.

Figure 6:
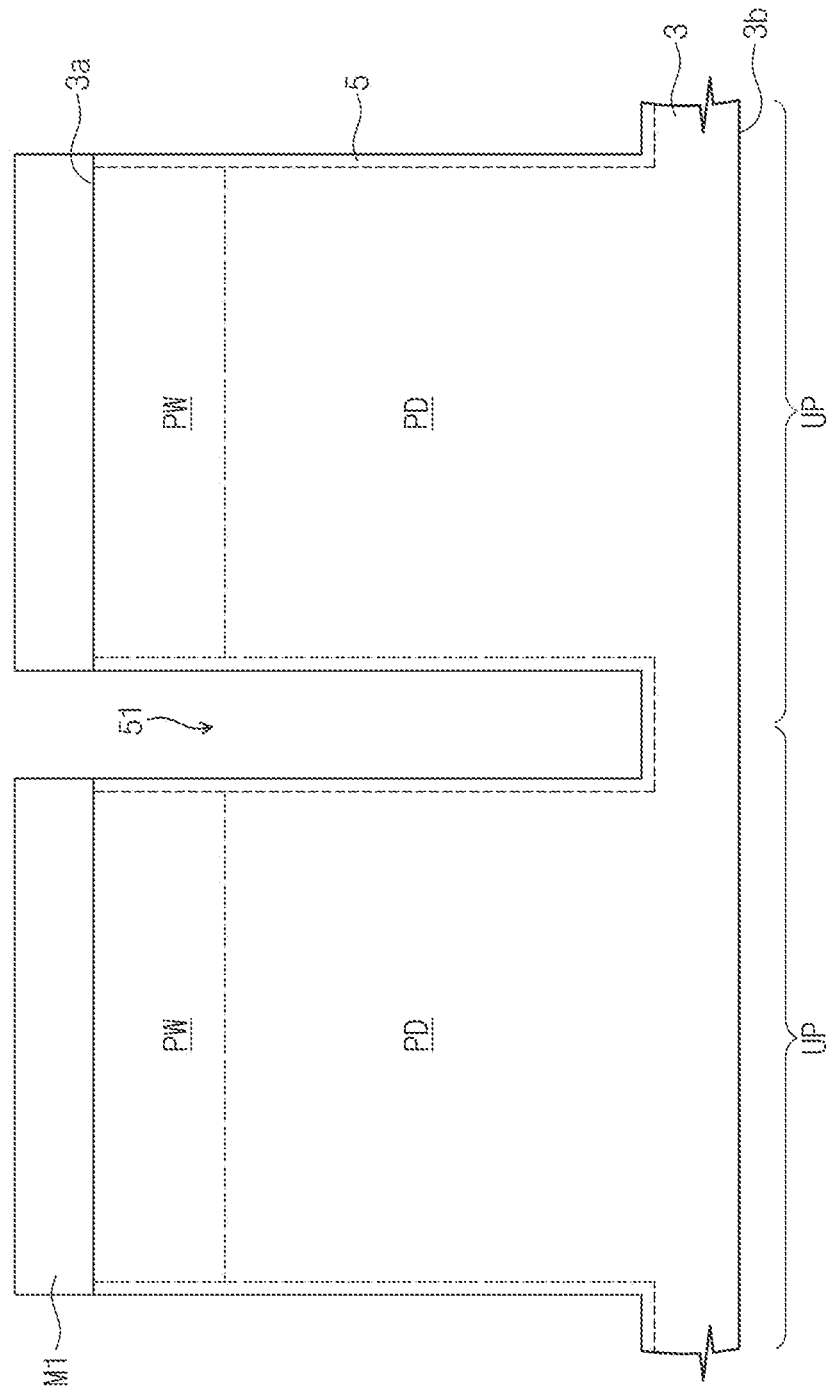

Referring to FIG. 6, at least one of an ion implantation process and a plasma-assisted doping process may be performed to form the impurity doped region 5 on the substrate 3 adjacent to sidewalls and bottom of the front deep trench 51. The impurity doped region 5 may be doped with, for example, p-type impurities.

Figure 7:
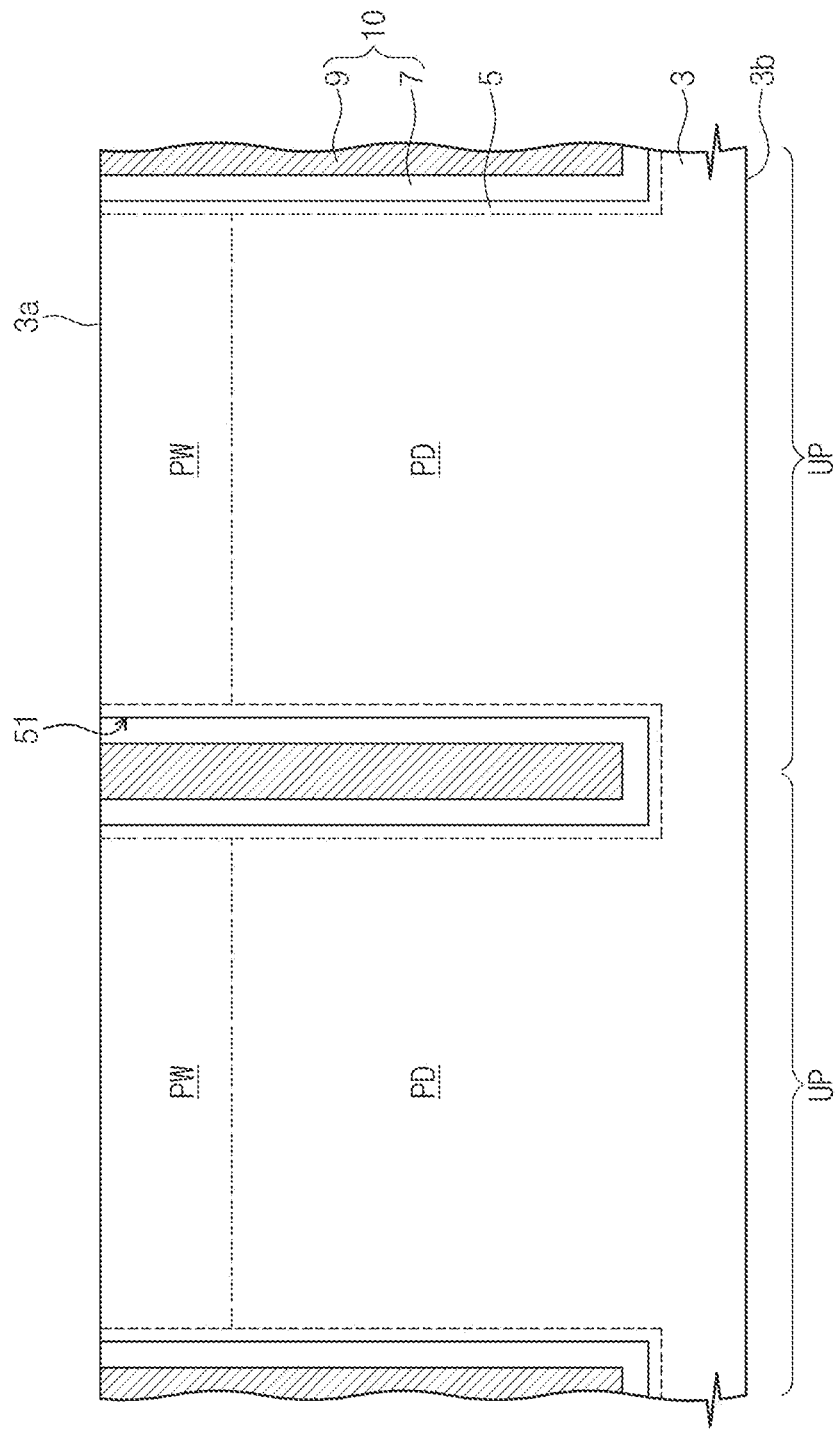

Referring to FIG. 7, the first mask pattern M1 may be removed. An insulation liner and a polysilicon layer may be conformally formed on the front surface 3a of the substrate 3 to fill the front deep trench 51. Thereafter, a planarization process may be performed to form an insulation liner pattern 7 and a polysilicon pattern 9 in the front deep trench 51. The insulation liner pattern 7 and the polysilicon pattern 9 may be formed of an oxide based material. The insulation liner pattern 7 and the polysilicon pattern 9 may constitute a preliminary deep device isolation layer 10. The preliminary deep device isolation layer 10 may define each of the unit pixel regions UP.

Figure 8:
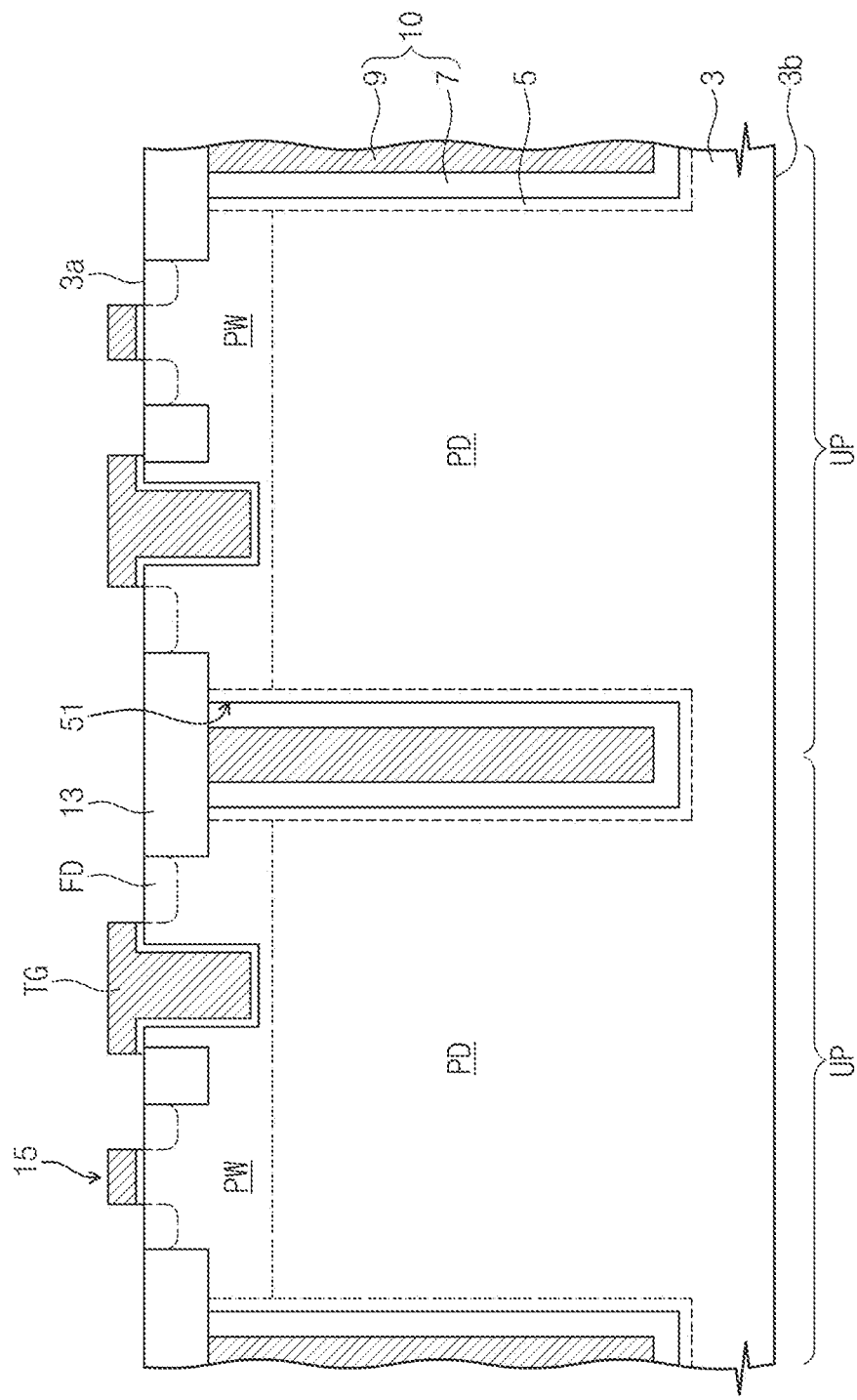

Referring to FIG. 8, the front surface 3a of the substrate 3 may be patterned to form a shallow trench, and then the shallow trench may be filled with the shallow device isolation layer 13 to define active regions. The shallow device isolation layer 13 may be formed of a silicon oxide based material. The shallow device isolation layer 13 may be formed to overlap the front deep trench 51. The transfer gate TG, the floating diffusion region FD, and the transistor 15 may be formed on the front surface 3a.

Figure 9:
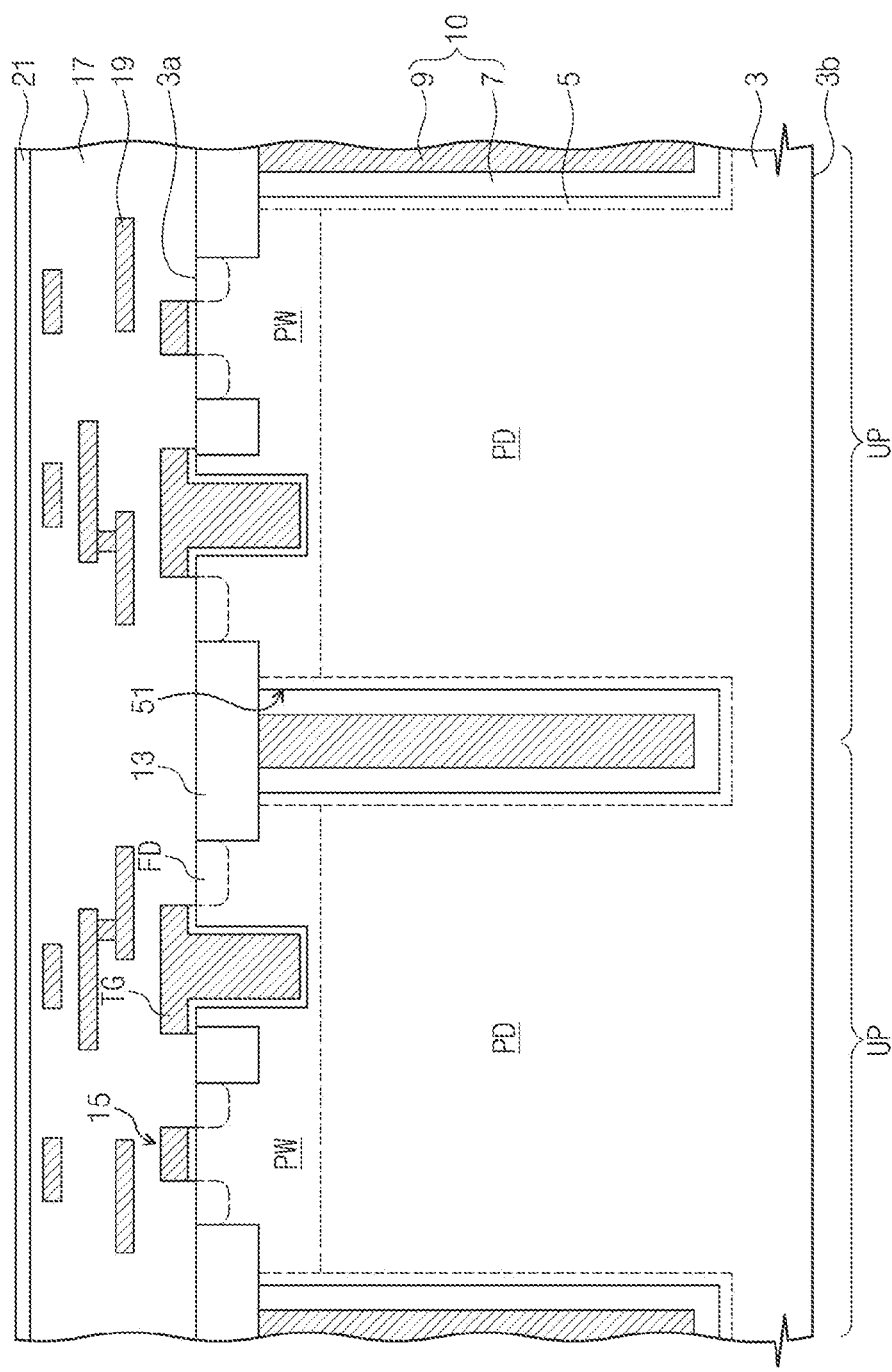

Referring to FIG. 9, the lines 19, the inter-dielectric layer 17 and the first passivation layer 21 may be formed on the front surface 3a of the substrate 3.

Figure 10:
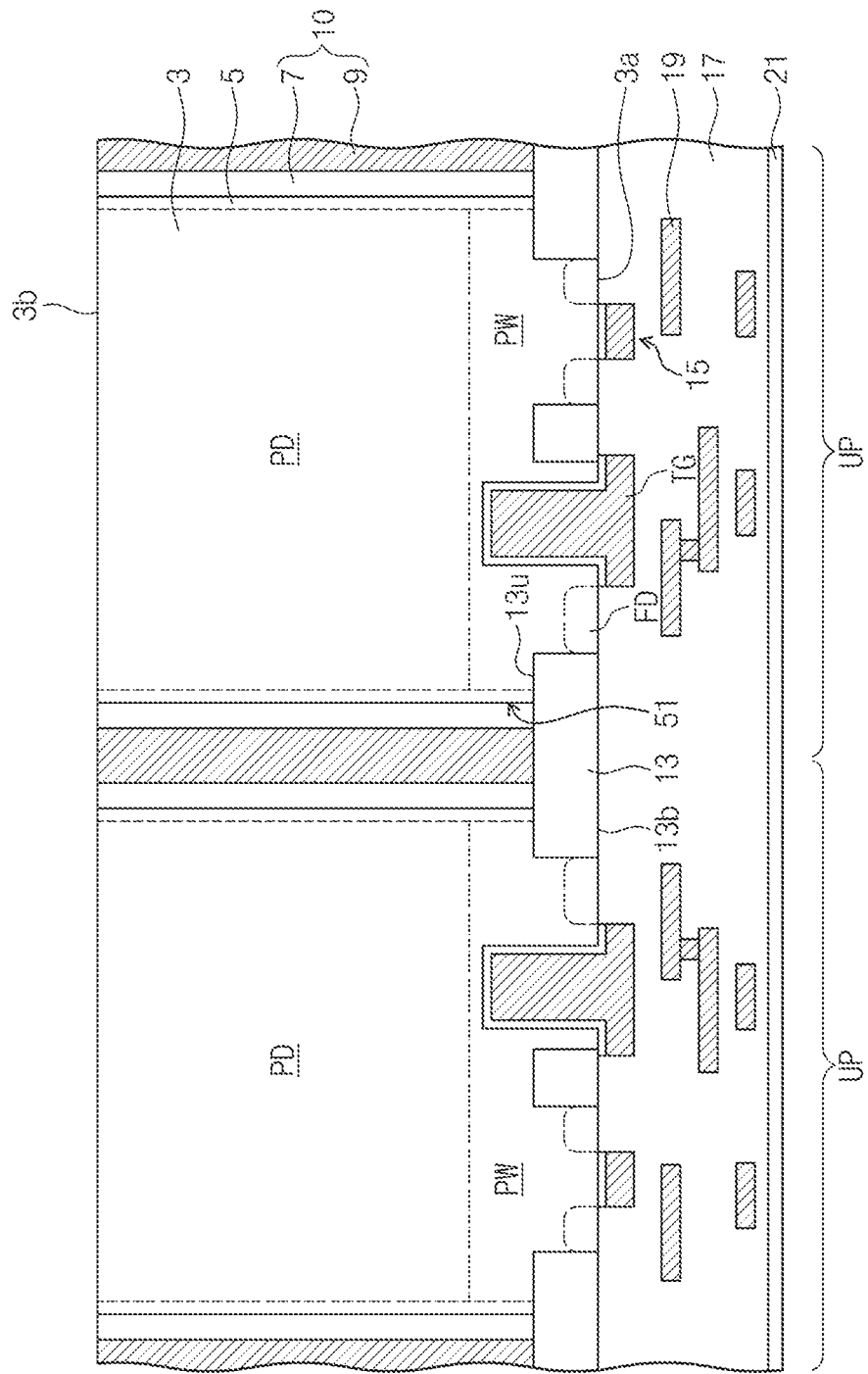

Referring to FIG. 10, the substrate 3 may be turned over in such a way that the backside surface 3b faces upward. A planarization process may be performed to remove a portion of the substrate 3 to expose the polysilicon pattern 9 and the insulation liner pattern 7.

Figure 11:
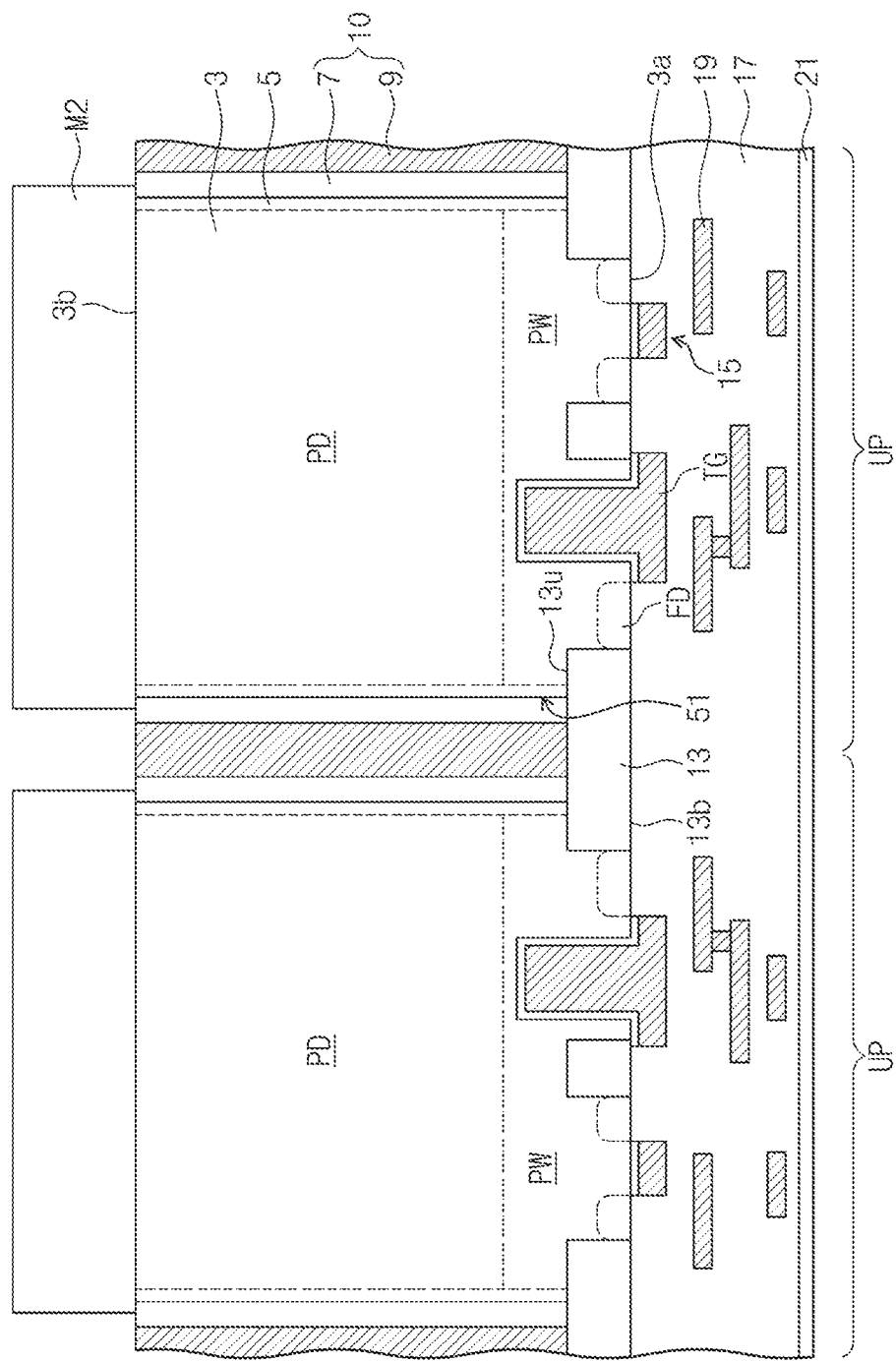

Referring to FIG. 11, a second mask pattern M2 may be formed on the backside surface 3b of the substrate 3. The second mask pattern M2 may be formed to cover the substrate 3 and expose the polysilicon pattern 9 and the insulation liner pattern 7.

Figure 12:
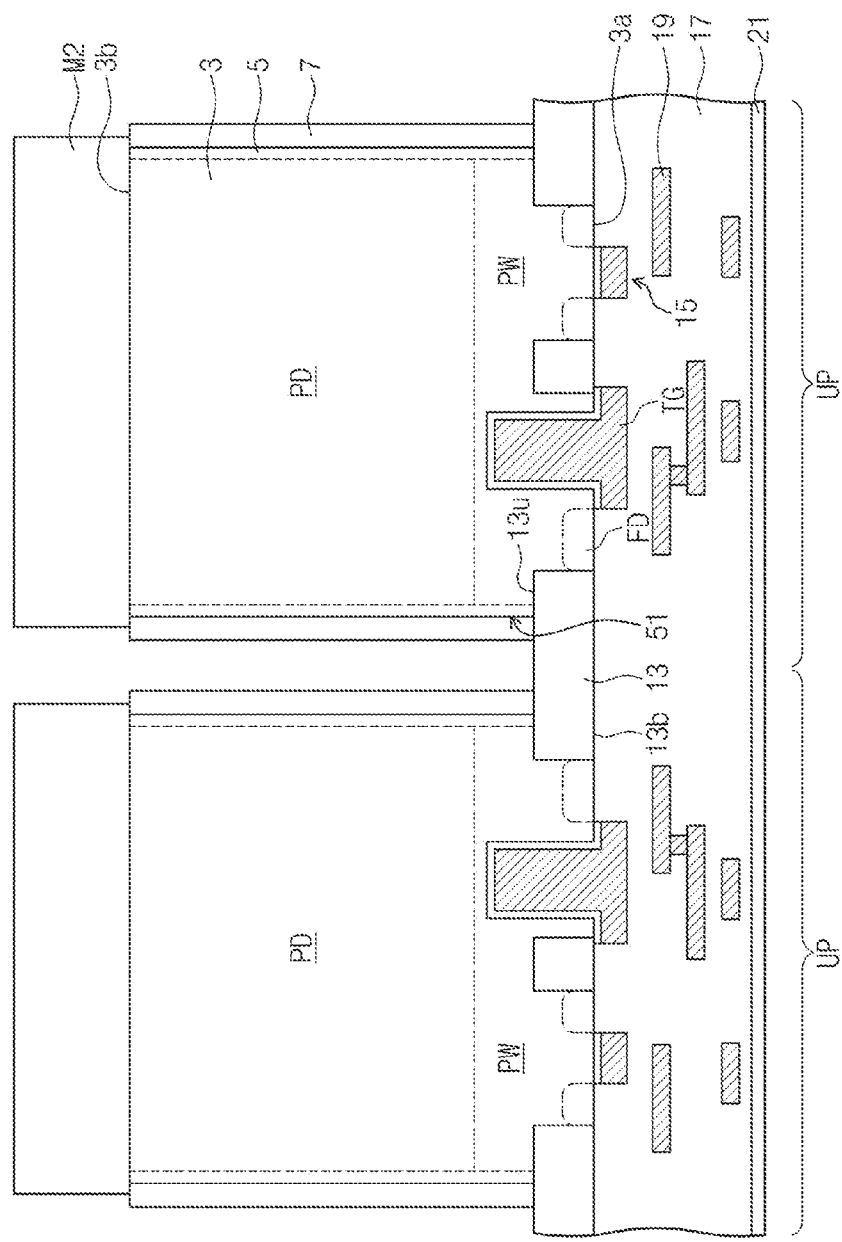

Referring to FIG. 12, the polysilicon pattern 9 exposed by the second mask pattern M2 may be selectively removed. An etch process, for example, an isotropic etch process may be performed to selectively remove the polysilicon pattern 9. Consequently, a sidewall of the insulation liner pattern 7 and a top surface 13u of the shallow device isolation layer 13 may be exposed.

Figure 13:
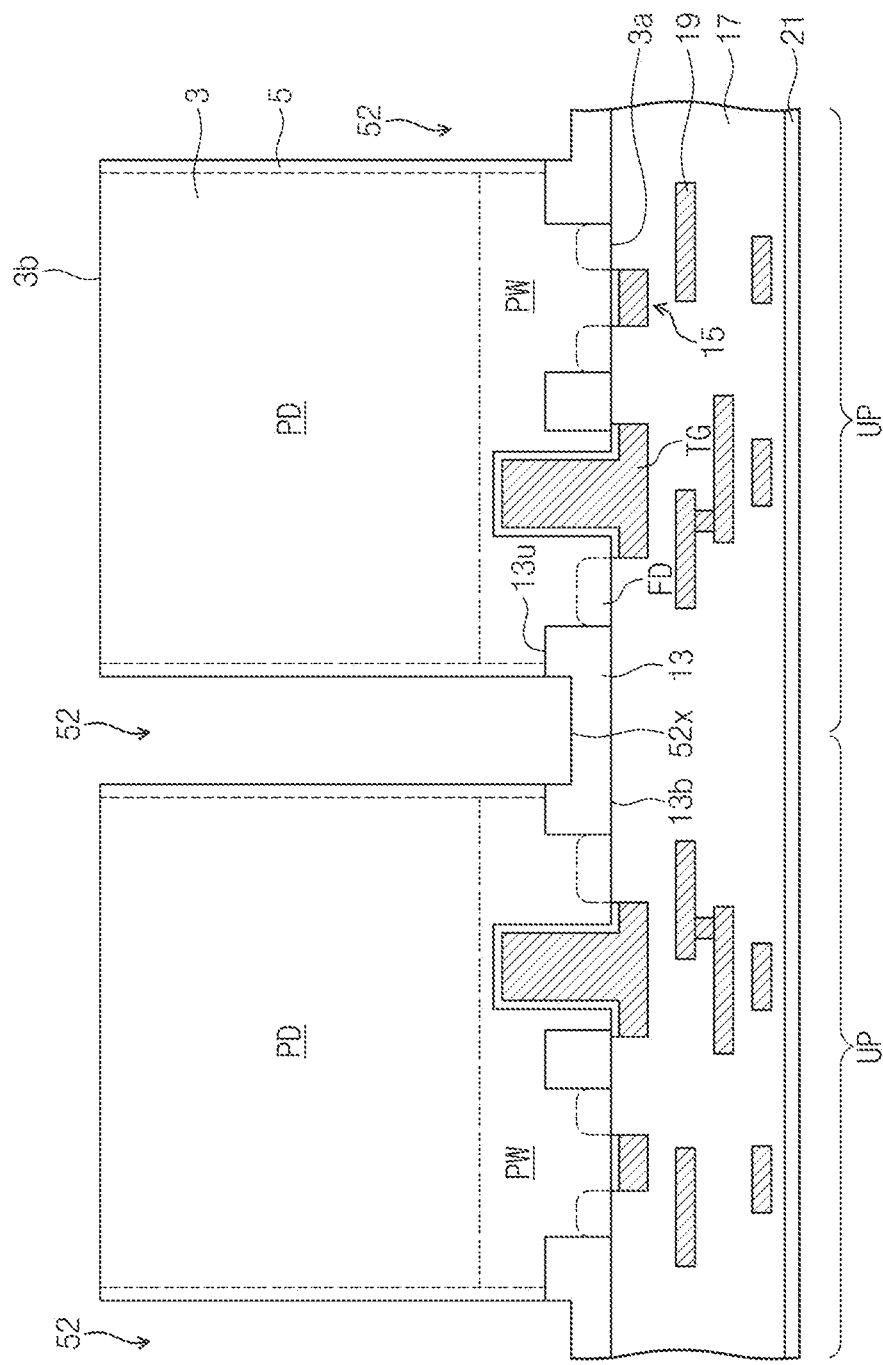

Referring to FIG. 13, the insulation liner pattern 7 may be selectively removed to form the backside deep trench 52. The backside deep trench 52 may be formed to overlap the front deep trench 51 and further extend toward the front surface 3a from the backside surface 3b. The insulation liner pattern 7 may be removed by an isotropic etch process. During the removal of the insulation liner pattern 7, a portion of the shallow device isolation layer 13 having the same material as the insulation liner pattern 7 may also be removed. The bottom surface 52x of the backside deep trench 52 may be spaced apart from both the top surface 13u and the bottom surface 13b of the shallow device isolation layer 13. According to some embodiments of the present inventive concept, the backside deep trench 52 is formed, and thus, it may be possible to reduce the likelihood, or possibly prevent, the positional misalignment of the backside deep trench 52. Accordingly, the process yield may be improved and the fabrication cost may be reduced in accordance with some embodiments discussed herein.

Figure 14:
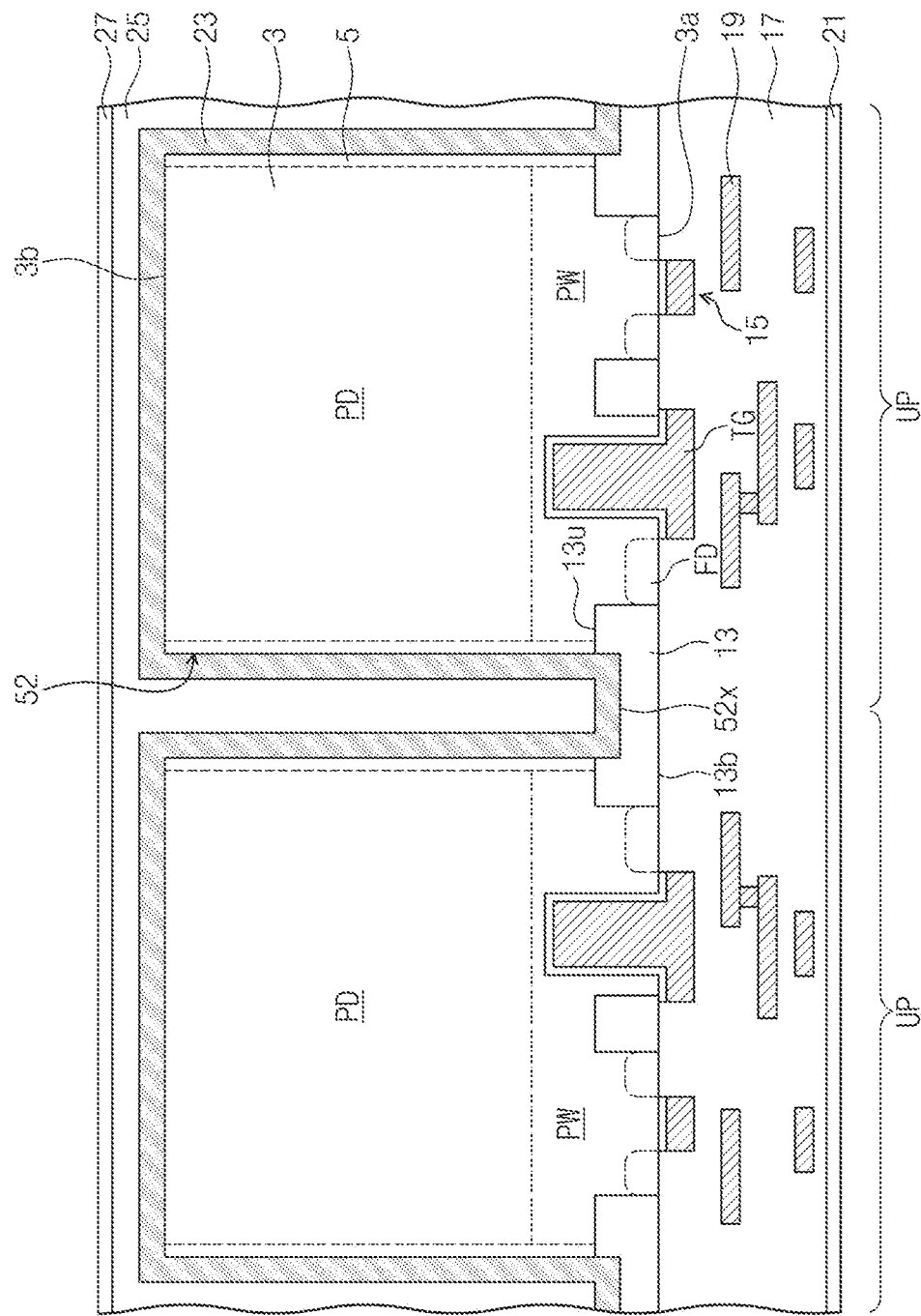

Referring to FIG. 14, the negative fixed charge layer 23 may be conformally deposited on the backside 3b of the substrate 3. The negative fixed charge layer 23 may be formed using a chemical deposition process or an atomic layer deposition process. The negative fixed charge layer 23 may be a metal oxide layer containing oxygen whose amount is less than the stoichiometric ratio. The negative fixed charge layer 23 may be formed of a metal oxide layer including hafnium (Hf), zirconium (Zr), aluminum (Al), tantalum (Ta), titanium (Ti), yttrium (Y), and/or lanthanide. After forming the negative fixed charge layer 23, subsequent processes may be performed at or under the temperature for the formation of the negative fixed charge layer 23. For example, the subsequent processes may be performed at the temperature of about 200° C. or less. As a result, it may be possible to realize that the negative fixed charge layer 23 maintains an oxygen amount less than the stoichiometric ratio and has the negatively fixed charges.

The filling insulation layer 25 may be formed on the backside surface 3b of the substrate 3 to fill the backside deep trench 52. The second passivation layer 27 may be formed on the filing insulation layer 25. The color filter 29 and the micro-lens 31 may be sequentially formed on each of the unit pixel regions UP, as illustrated in FIG. 3.

It will be understood that it may be possible to change the sequence of the processing steps in the fabrication of the image sensor. Also, the preliminary deep device isolation layer 10 may be formed of a single sacrificial layer. According to some embodiments, the backside deep trench 52 is formed using the preliminary deep device isolation layer 10 as a sacrificial layer. As a result, it may be possible to reduce the likelihood, or possibly prevent, the positional misalignment of the backside deep trench 52, thereby improving the process yield and reducing the fabrication cost.

Figure 15:
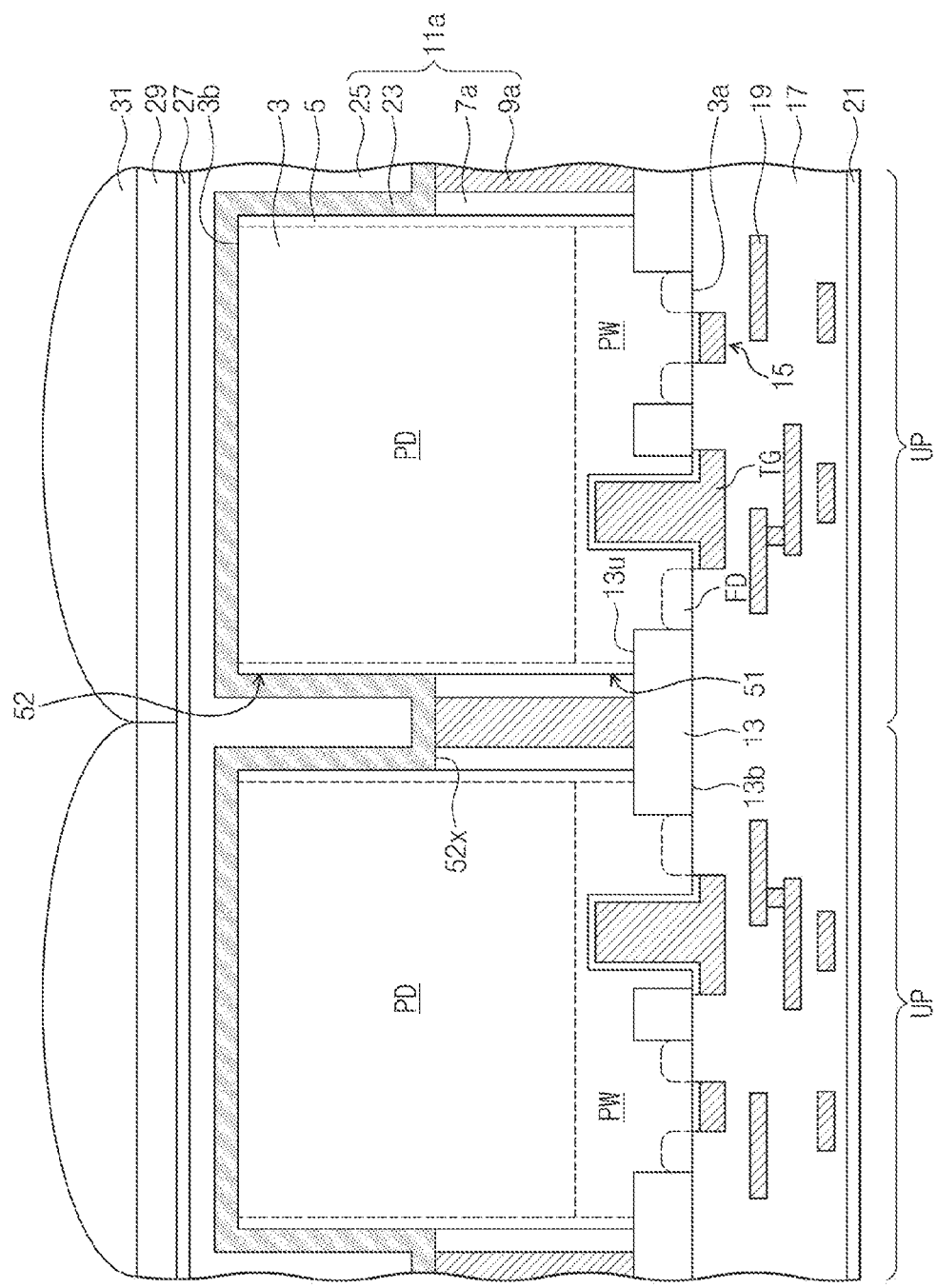
FIG. 15 is a cross section illustrating an image sensor according to some embodiments of the present inventive concept.

Referring now to FIG. 15, a cross section illustrating an image sensor according to some embodiments of the present inventive concept will be discussed. The image sensor of FIG. 15 may be configured to have substantially similar features as those of the image sensor of FIG. 3, except as discussed below. Thus, details discussed above with respect to FIG. 3 will not be discussed further herein in the interest of brevity.

As illustrated in FIG. 15, a portion of the deep trenches 51 and 52 may be filled with a remaining polysilicon pattern 9a and a remaining insulation liner pattern 7a, and then the negative fixed charge layer 23 and the filling insulation layer 25 may be formed thereon. In other words, the remaining polysilicon pattern 9a, the insulation line pattern residue 7a, the negative fixed charge layer 23, and the filling insulation layer 25 disposed in the deep trenches 51 and 52 may constitute a deep device isolation layer 11a.

In the image sensor of FIG. 15, the negative fixed charge layer 23 may surround a top surface and a portion of sidewall of the photoelectric conversion region PD, thereby possibly reducing the dark current and the white spot. Since the remaining polysilicon pattern 9a has a coefficient of thermal expansion substantially similar to that of silicon in the substrate 3, it may be possible to reduce the physical stress generated from differences between thermal expansions of materials included the image sensor.

Figure 16:
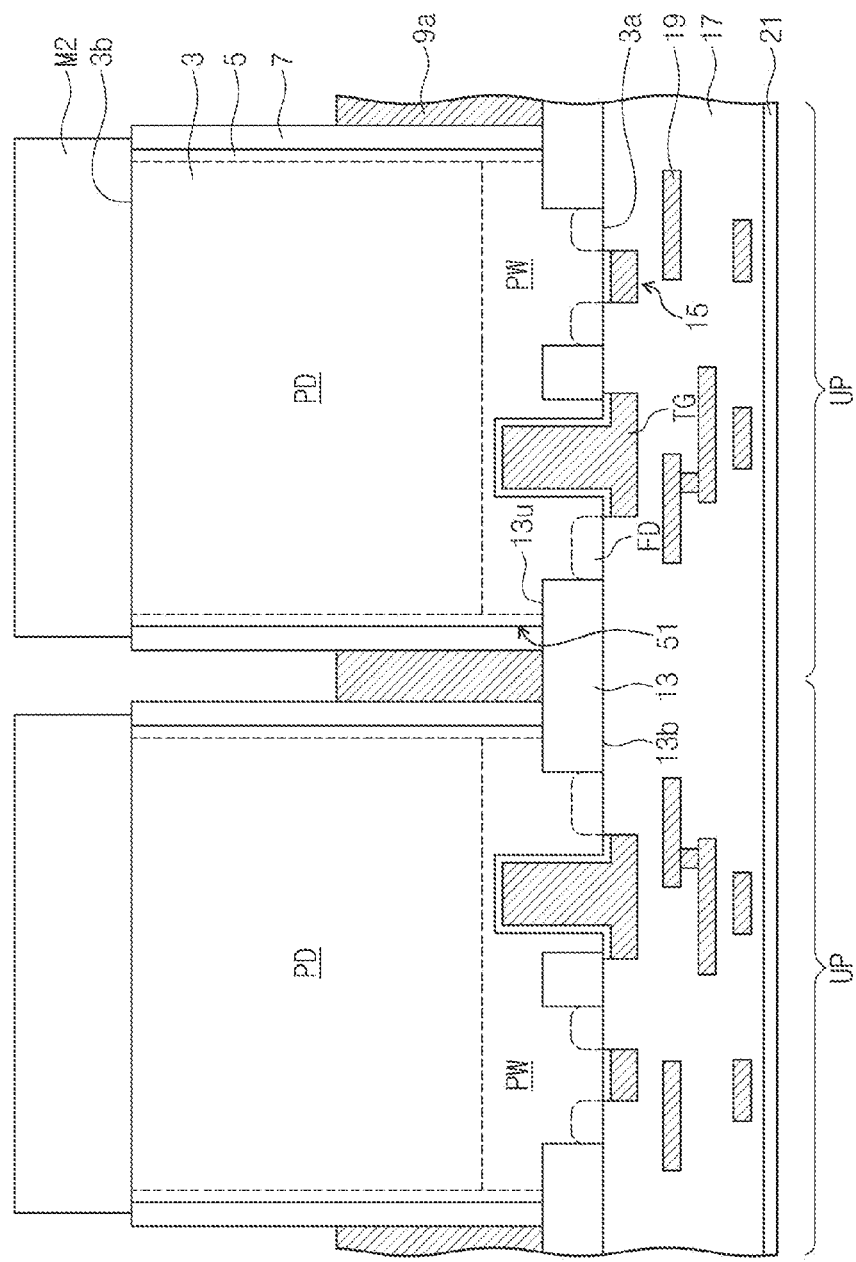
FIGS. 16 and 17 are cross sections illustrating processing steps in the fabrication of the image sensor of FIG. 15.
Figure 17:
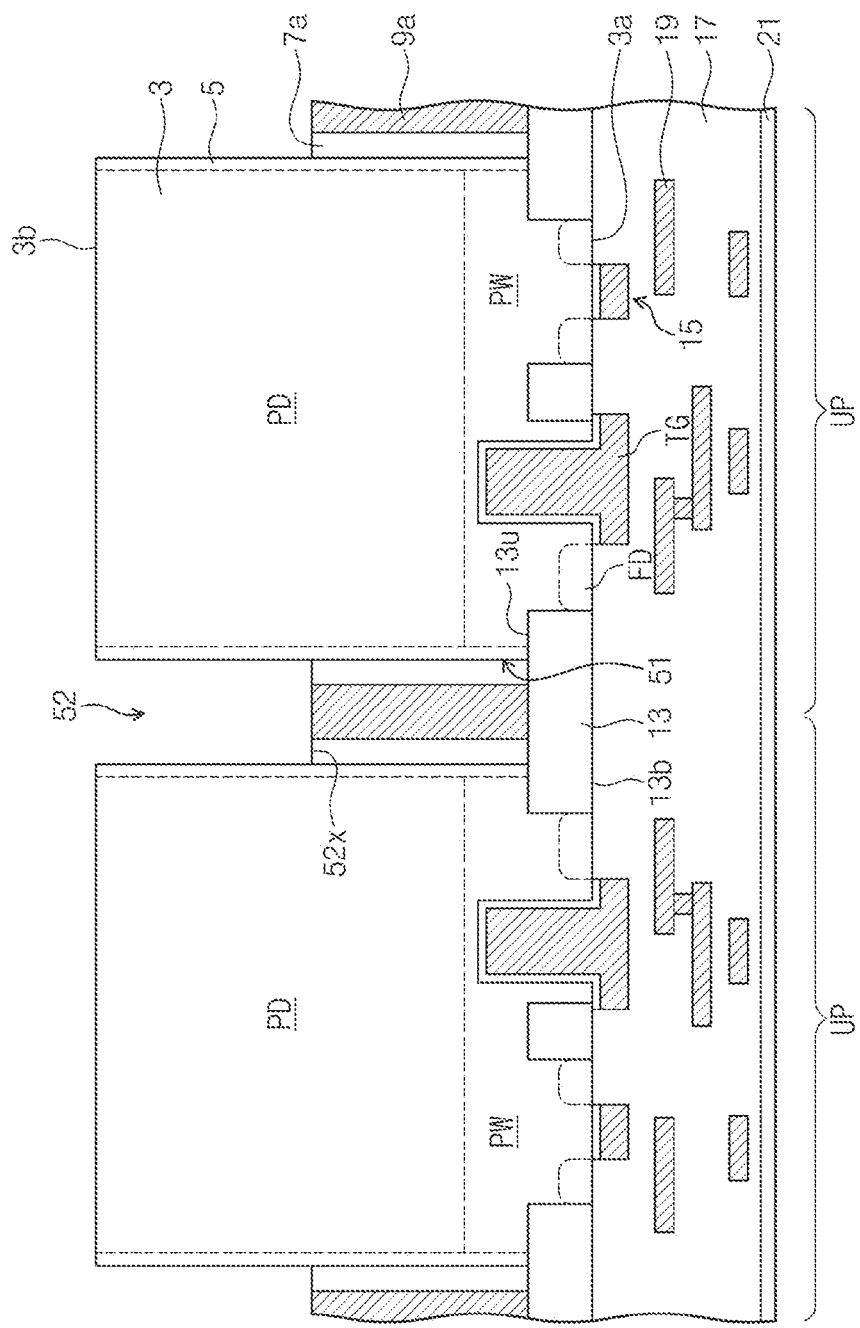

FIGS. 16 and 17 are cross sections illustrating processing steps in the fabrication of the image sensor of FIG. 15. Referring first to FIG. 16, after forming the second mask pattern M2 exposing the polysilicon pattern 9 and the insulation liner pattern 7 as illustrated in FIG. 11, a portion of the polysilicon pattern 9 may be removed to leave the remaining polysilicon pattern 9a.

As illustrated in FIG. 17, the second mask pattern M2 may be removed. A portion of the insulation liner pattern 7 may be removed to leave the remaining insulation liner pattern 7a, thereby forming the backside deep trench 52. The backside deep trench 52 may be formed to overlap the front deep trench 51. The remaining polysilicon pattern 9a and the remaining insulation liner pattern 7a may be exposed through the bottom surface 52x of the backside deep trench 52.

Thereafter, the negative fixed charge layer 23 may be conformally deposited on the backside 3b of the substrate 3 as illustrated in FIG. 15. Subsequent processes may be performed in the same or similar manner as that described with respect to FIG. 14.

Figure 18:
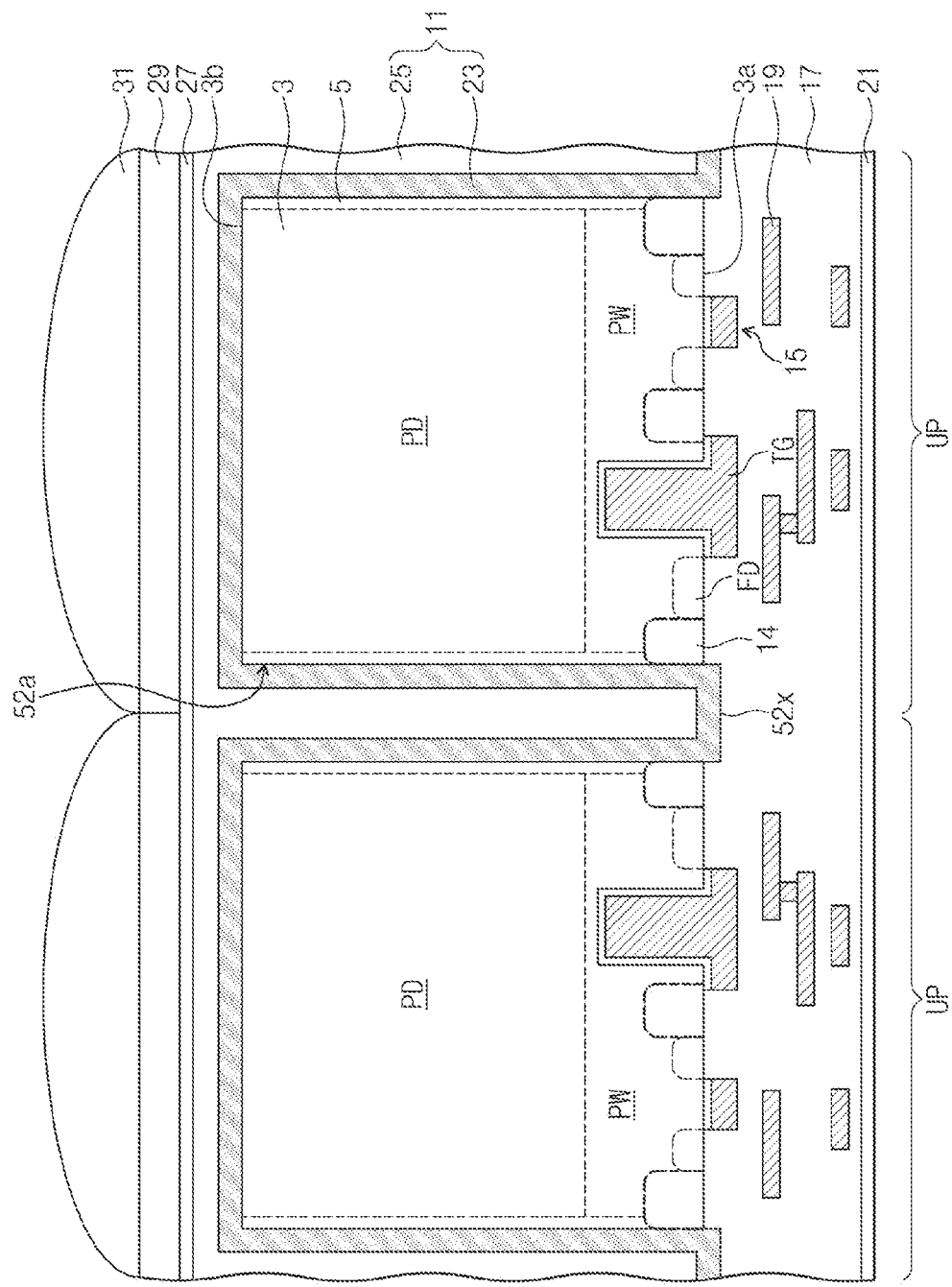
FIG. 18 is a cross section illustrating an image sensor according to some embodiments of the inventive concept.

Referring now to FIG. 18, a cross section illustrating an image sensor according to some embodiments of the inventive concept will be discussed. The image sensor of FIG. 15 may be configured to have substantially similar features as those of the image sensor of FIG. 3, except as discussed below. Thus, details discussed above with respect to FIG. 3 will not be discussed further herein in the interest of brevity.

As illustrated in FIG. 18, the shallow device isolation layer 14 may not be formed, but a channel stop layer 14 may be provided on the front surface 3a of the substrate 3. The channel stop layer 14 may be doped with impurities having a different conductivity from the photoelectric conversion region PD and the floating diffusion region FD. The channel stop layer 14 may be doped to have the same conductivity type as the well region PW and a higher doping concentration than the well region PW. The negative fixed charge layer 23 may have a bottom portion protruding over the front surface 3a.

Figure 19:
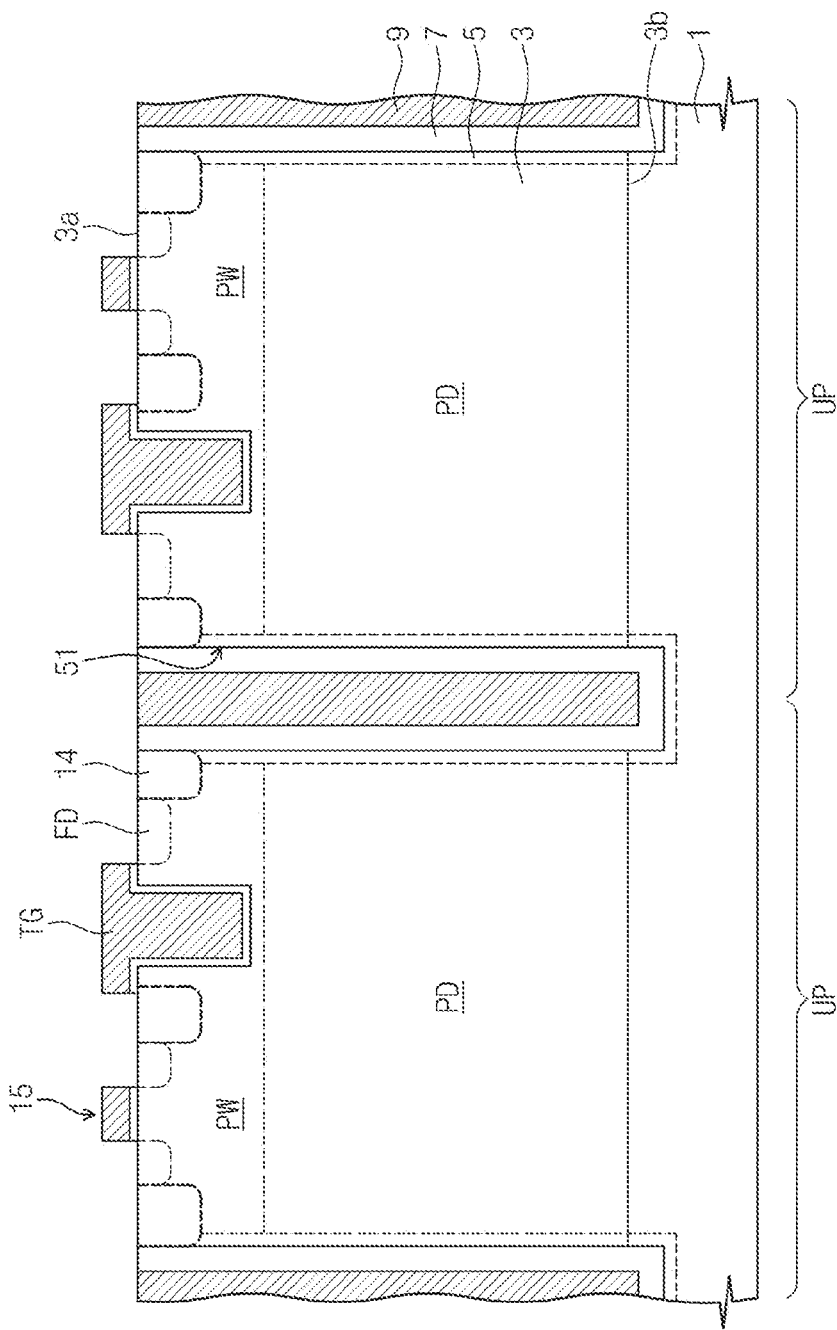
FIGS. 19 to 21 are cross sections illustrating processing steps in the fabrication of the image sensor of FIG. 18.
Figure 20:
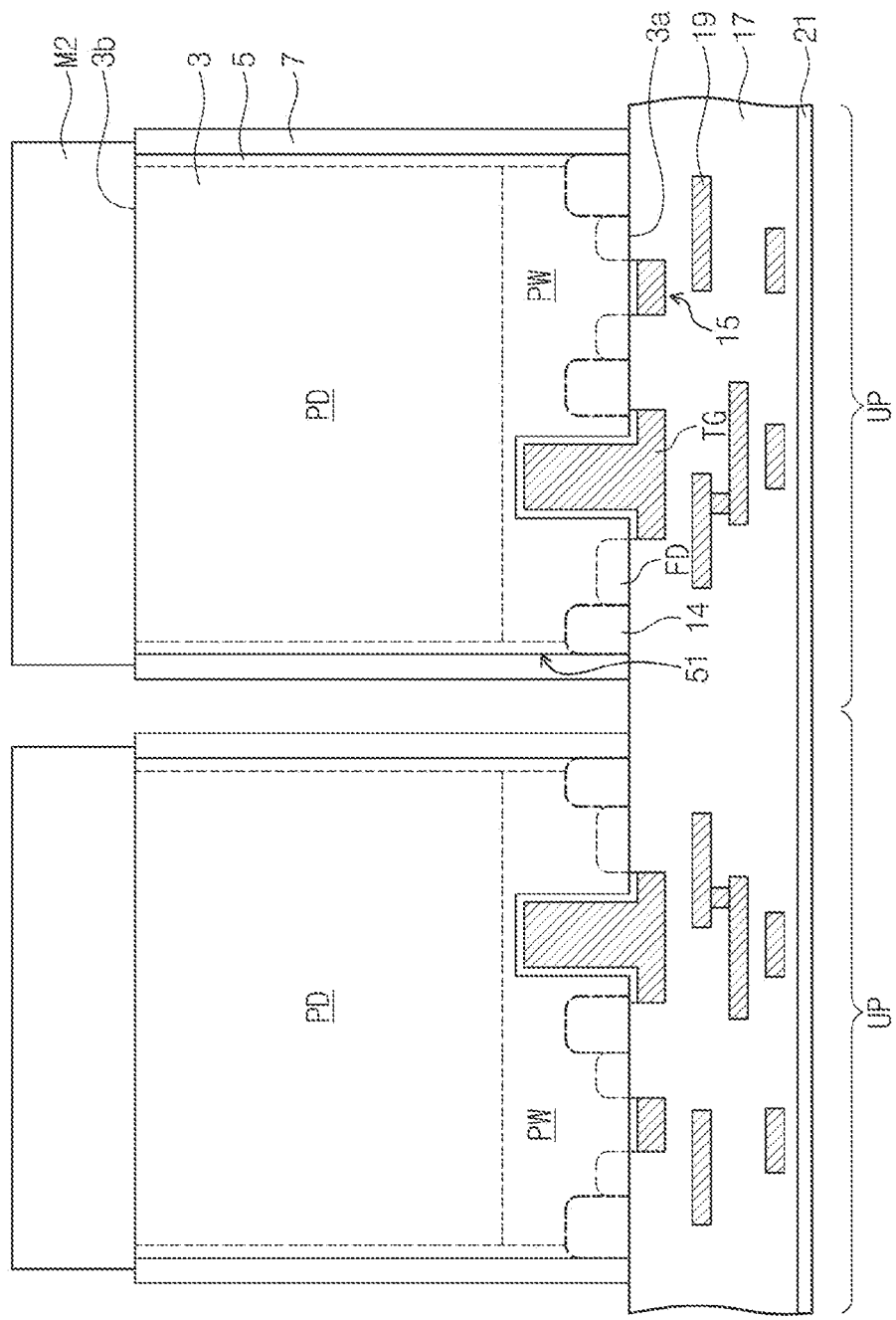
Figure 21:
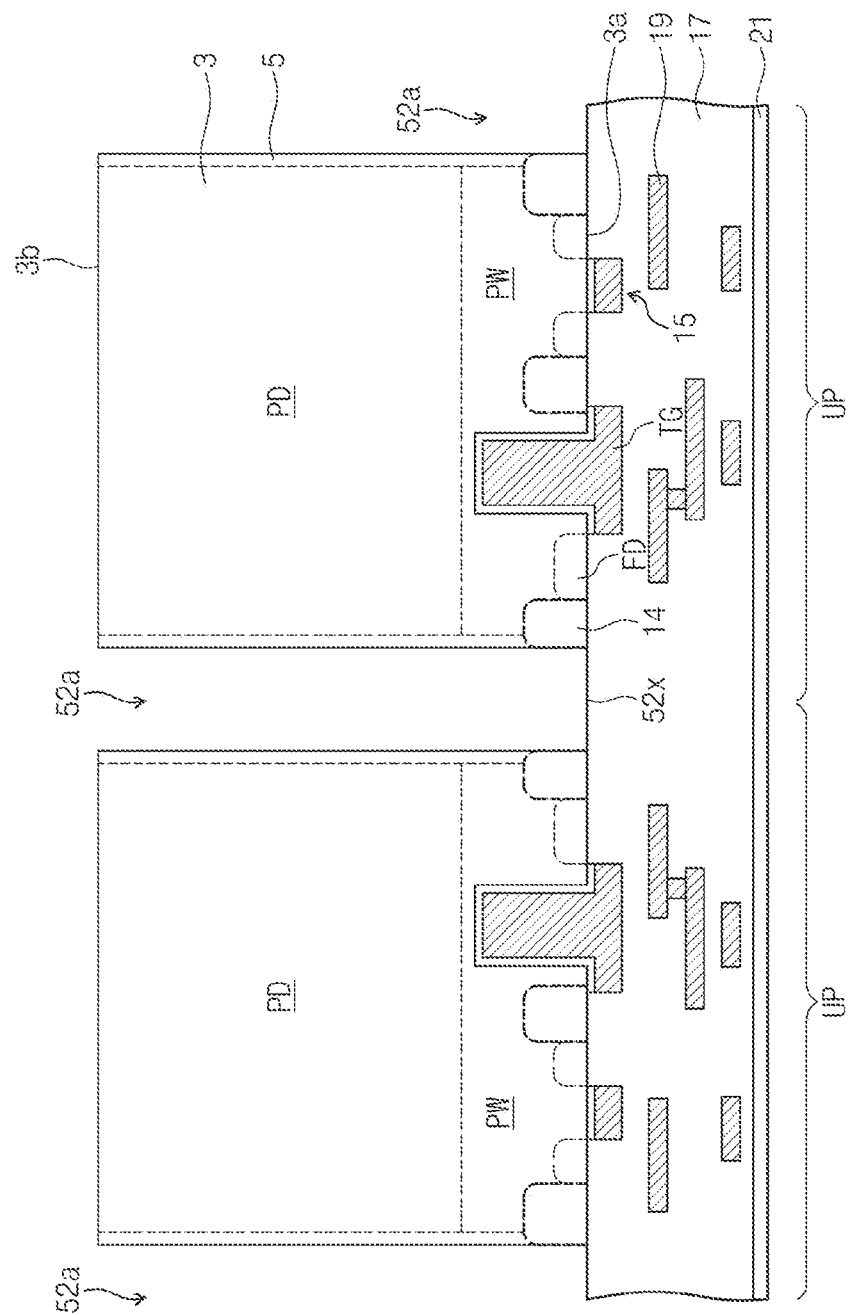

FIGS. 19 to 21 are cross sections illustrating processing steps in the fabrication of the image sensor of FIG. 18. Referring first to FIG. 19, the channel stop layer 14 may be formed on the front surface 3a of the substrate 3 to define active regions as discussed above with respect to FIG. 7. The channel stop layer 14 may be formed by an ion implantation process. The transfer gate TG, the floating diffusion region FD, and the transistor 15 may be formed on the front surface 3a.

Referring to FIG. 20, the lines 19, the inter-dielectric layer 17 and the first passivation 21 may be formed on the front surface 3a. The substrate 3 may be turned over in such a way the backside surface 3b faces upward. A portion of the substrate 3 may be removed to expose the polysilicon pattern 9 and the insulation liner pattern 7. The second mask pattern M2 may be formed on the backside surface 3b. The exposed polysilicon pattern 9 that is not covered by the second mask pattern M2 may be selectively removed. Thus, the inter-dielectric layer 17 may be exposed.

Referring to FIG. 21, the second mask pattern M2 may be removed. The insulation liner pattern 7 may be selectively removed to form a backside deep trench 52a. As the inter-dielectric layer 17 is formed of a silicon oxide based material the same as the insulation liner pattern 7, a portion of the inter-dielectric layer 17 may also be removed together with the insulation liner pattern 7. As a result, the bottom surface 52x of the backside deep trench 52a may have a level lower than the front surface 3a.

Referring again to FIG. 18, the negative fixed charge layer 23 and the filling insulation layer 25 may be formed. Subsequent processes may be substantially similar to those discussed above with reference to FIG. 14 and, thus, will not be repeated herein in the interest of brevity.

Figure 22:
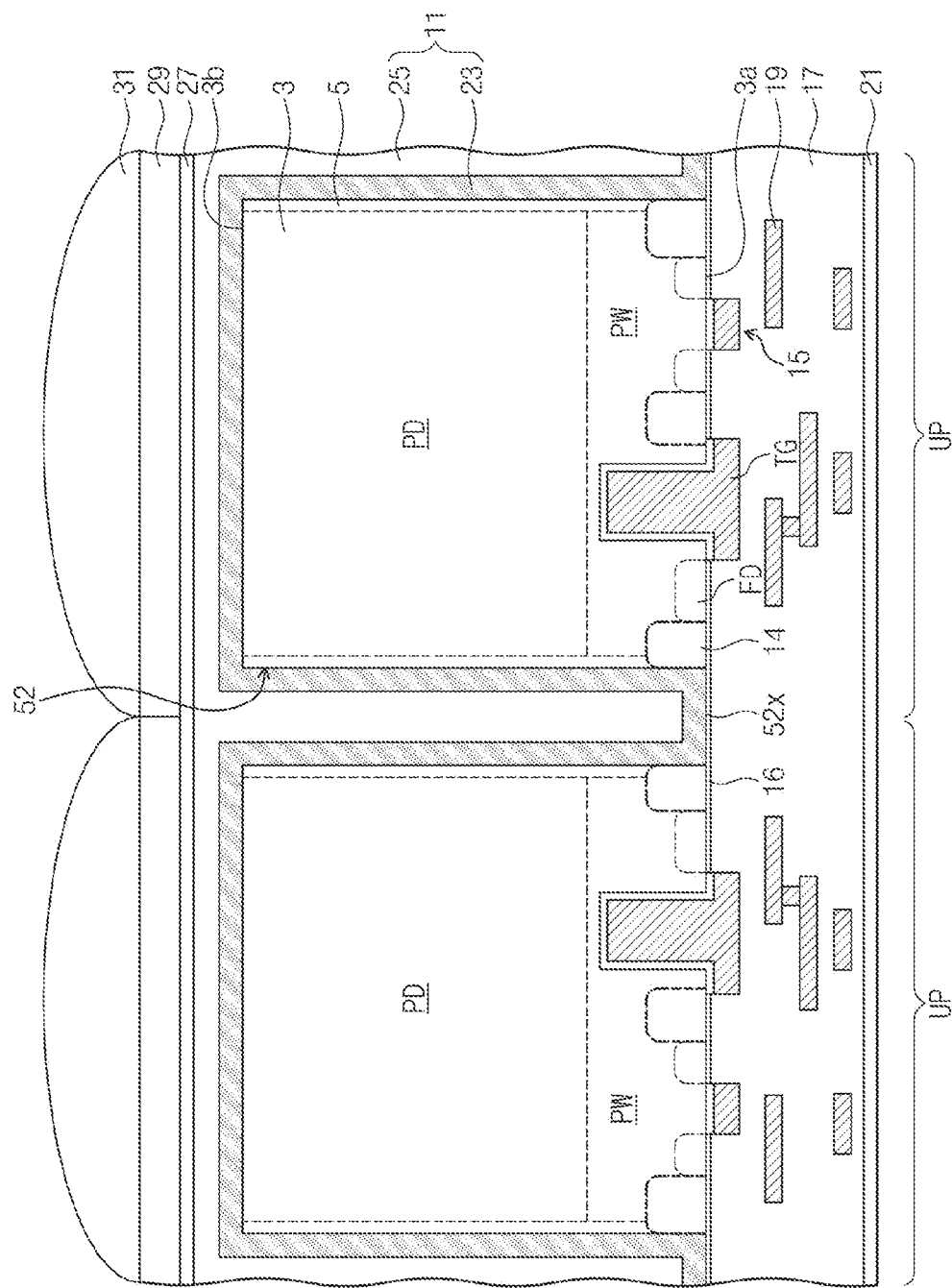
FIG. 22 is a cross section illustrating an image sensor according to some embodiments of the inventive concept.

Referring now to FIG. 22, a cross section illustrating an image sensor according to some embodiments of the inventive concept will be discussed. The image sensor of FIG. 22 may be configured to have substantially similar features as those of the image sensor of FIG. 18, except as discussed below. Thus, details discussed above with respect to FIG. 18 will not be discussed further herein in the interest of brevity.

As illustrated in FIG. 22, an etch stop layer 16 may be disposed on the front surface 3a of the substrate 3. The negative fixed charge layer 23 may include a bottom surface in contact with the etch stop layer 15 and having the same level as the front surface 3a.

Figure 23:
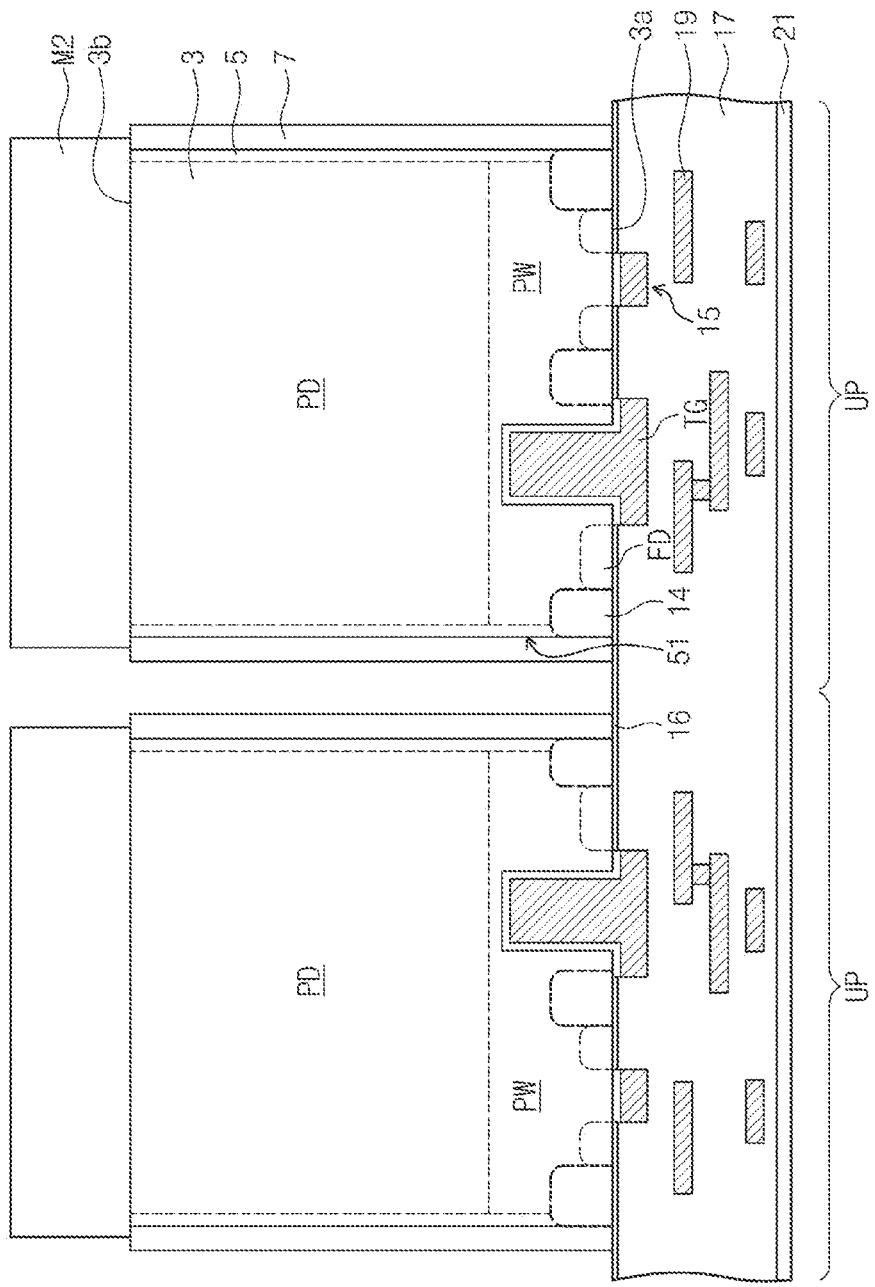
FIG. 23 is a cross section illustrating processing steps in the fabrication of the image sensor of FIG. 22.

Referring now to FIG. 23, a cross section illustrating processing steps in the fabrication of the image sensor of FIG. 22 will be discussed. As illustrated in FIG. 23, the etch stop layer 16 may be formed on the front surface 3a of the substrate 3. The etch stop layer 16 may be formed of a material having an etch selectivity with respect to the insulation liner pattern 7. For example, the etch stop layer 16 may be formed of a silicon nitride layer. When the polysilicon pattern 9 is selectively removed as illustrated in FIG. 20, the etch stop layer 16 may be exposed and the inter-dielectric layer 17 may not be exposed. The etch stop layer 16 may reduce the likelihood that the inter-dielectric layer 17 will be etched when the insulation liner pattern 7 is removed. Other processes except for the above-described may be substantially similar to those described with reference to FIGS. 19 to 21.

Figure 24:
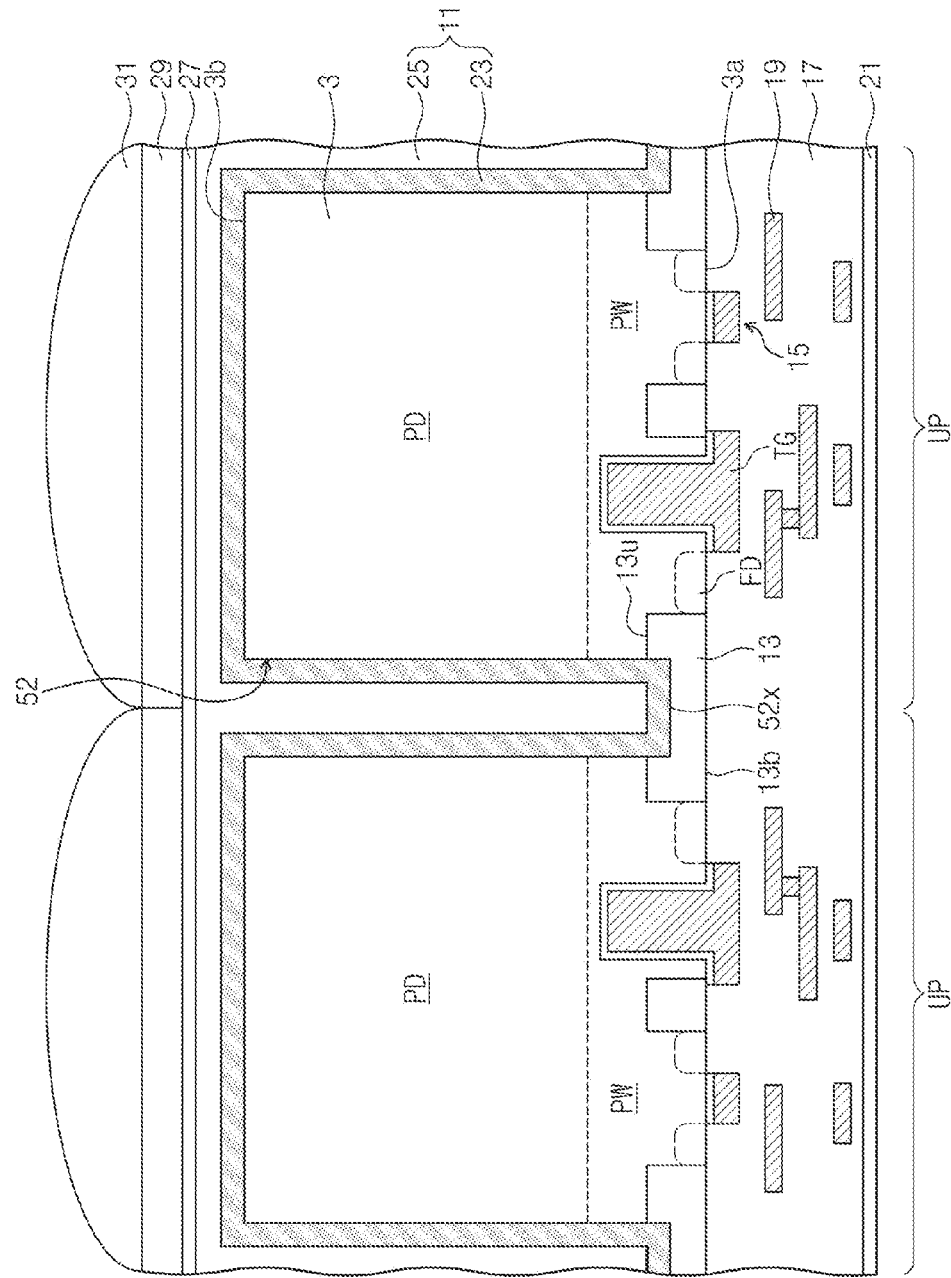
FIG. 24 is a cross section illustrating an image sensor according some embodiments of the inventive concept.

Referring now to FIG. 24, a cross section illustrating an image sensor according to some embodiments of the inventive concept will be discussed. The image sensor of FIG. 24 may be configured to have substantially similar features as those of the image sensor of FIG. 3, except as discussed below. Thus, details discussed above with respect to FIG. 3 will not be discussed further herein in the interest of brevity. As illustrated in FIG. 24, an image sensor may not include the impurity doped region 5 of FIG. 3.

Figure 25:
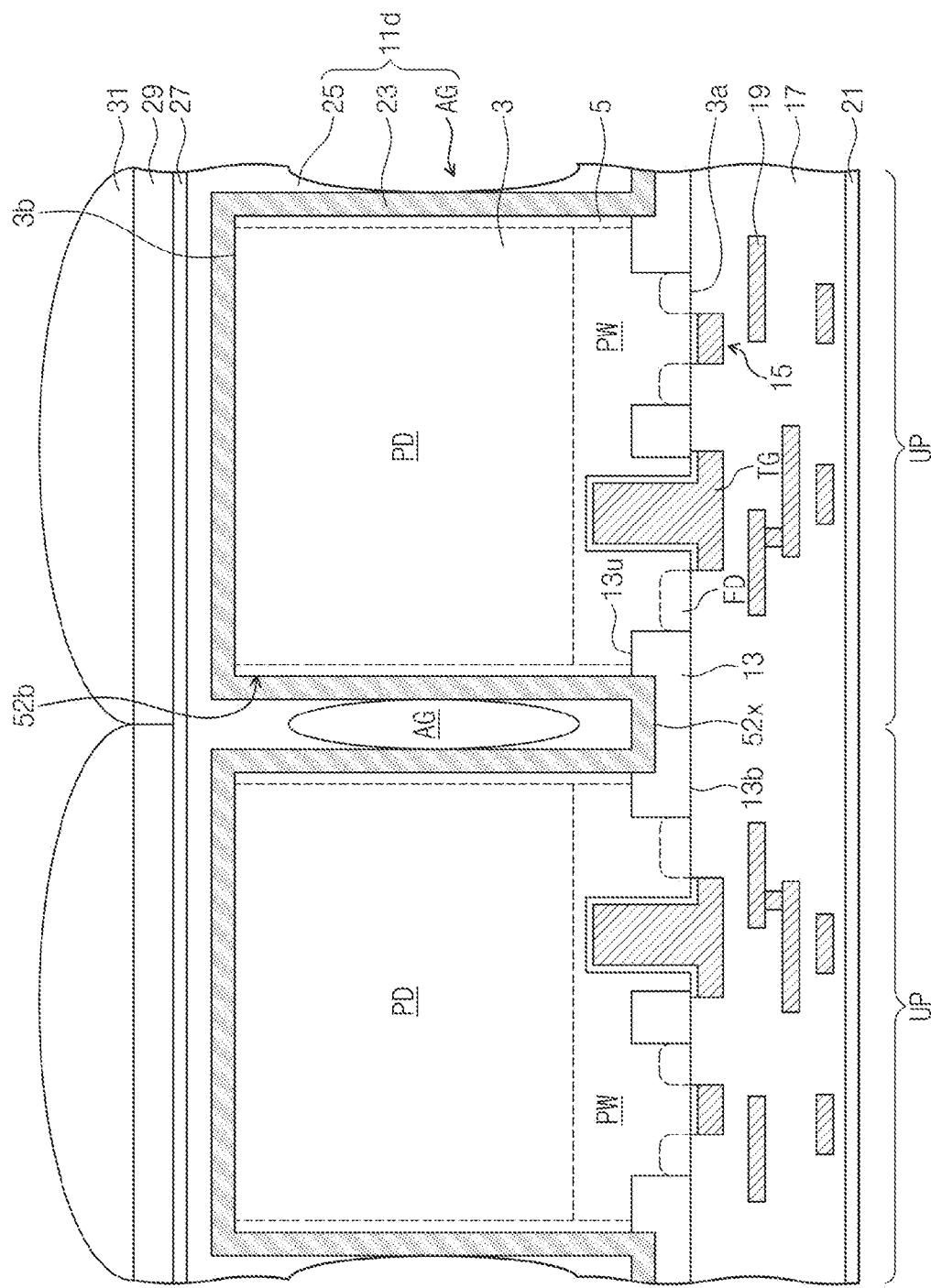
FIG. 25 is a cross section illustrating an image sensor according to some embodiments of the inventive concept.

Referring now to FIG. 25, a cross section illustrating an image sensor according to some embodiments of the inventive concept will be discussed. As illustrated in FIG. 25, an air-gap region AG may be disposed in the backside deep trench 52. The negative fixed charge layer 23, the filling insulation layer 25, and the air-gap region AG may constitute a deep device isolation layer 11d.

An image sensor of FIG. 25 may be fabricated by a deposition process having a poor step coverage. Consequently, the filling insulation layer 25 may not completely fill a narrow space of the backside deep trench 52 such that the air-gap region AG may be formed. Other processes except for the above-described may be substantially similar to those described with reference to FIGS. 3 to 14.

Figure 26:
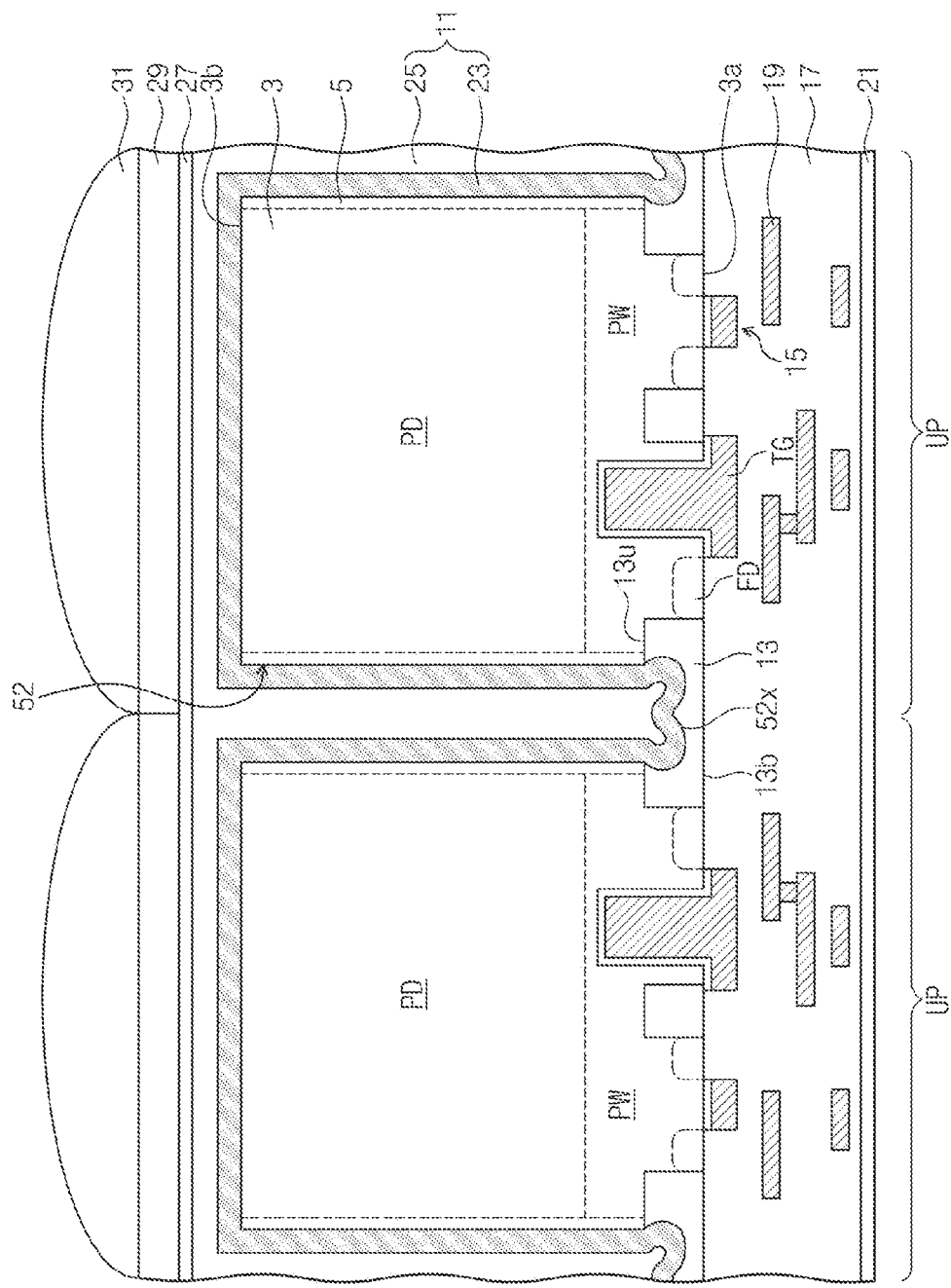
FIG. 26 is a cross section illustrating an image sensor according to some embodiments of the inventive concept.

Referring now to FIG. 26, a cross section illustrating an image sensor according to some embodiments of the inventive concept will be discussed. As illustrated in FIG. 26, the bottom surface 52x of the backside deep trench 52 may include a crooked shape having two joined recess portions. The negative fixed charge layer 23 may conformally cover the crooked bottom surface 52x. Therefore, the filling insulation layer 25 may include a lower portion having a shape of reversed-Y. The crooked bottom surface 52x of the backside deep trench 52 may be formed under process conditions different from those at the step of FIG. 13. Other processes except for the above-described may be substantially similar to those described with reference to FIGS. 3 to 14.

Figure 27:
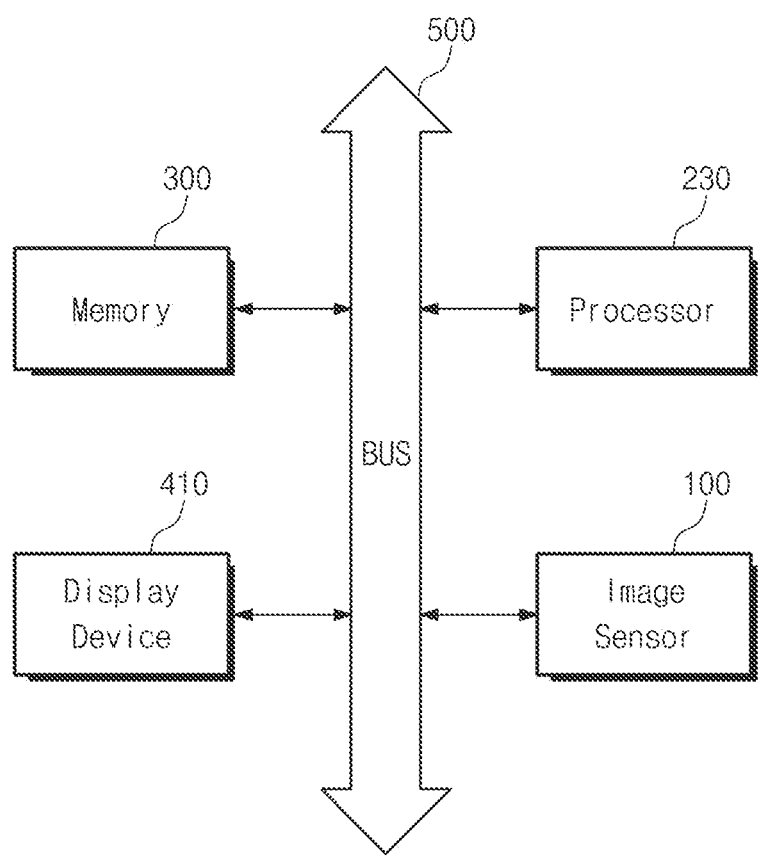
FIG. 27 is a block diagram illustrating an electronic device having an image sensor, according to some embodiments of the inventive concept.

Referring now to FIG. 27, a block diagram illustrating an electronic device having an image sensor according to some embodiments of the inventive concept will be discussed. The electronic device may be any of various types of devices, such as a digital camera or a mobile device. As illustrated in FIG. 27, an illustrative digital camera system includes an image sensor 100, a processor 230, a memory 300, a display device 410, and a bus 500. As shown in FIG. 27, the image sensor 100 captures an external image under control of the processor 230, and provides the corresponding image data to the processor 230 through the bus 500. The processor 230 may store the image data in the memory 300 through the bus 500. The processor 230 may also output the image data stored in the memory 300, for example, for display on the display device 410.

Figure 28:
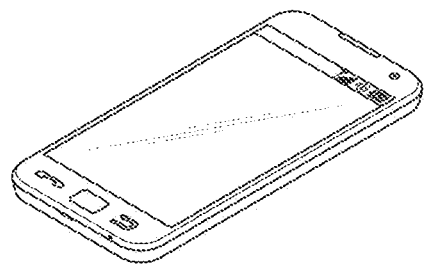
FIGS. 28 through 32 illustrate examples of multimedia devices, to which image sensors according to some embodiments of the inventive concept can be applied.
Figure 29:
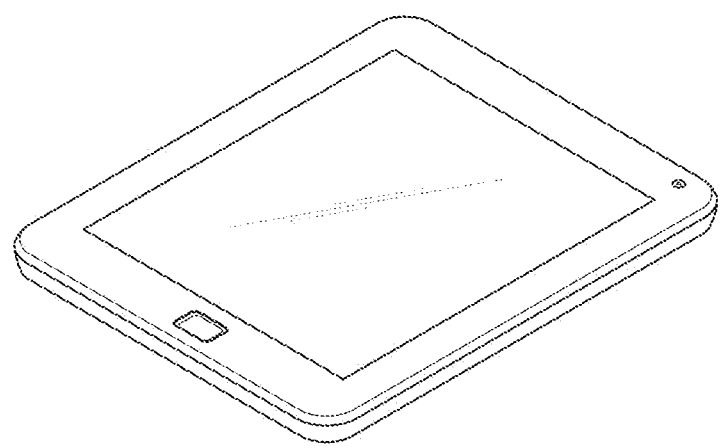
Figure 30:
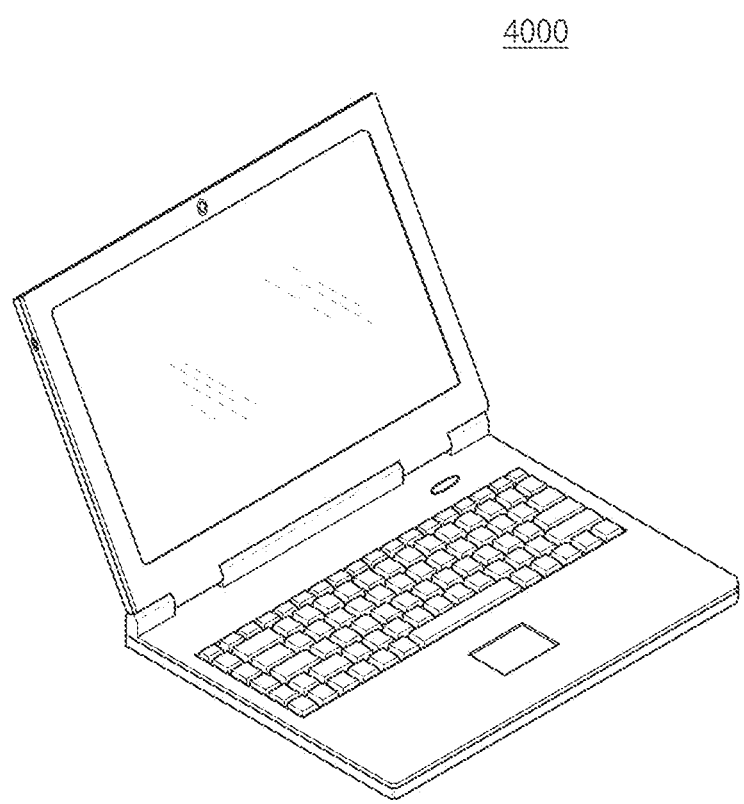
Figure 31:
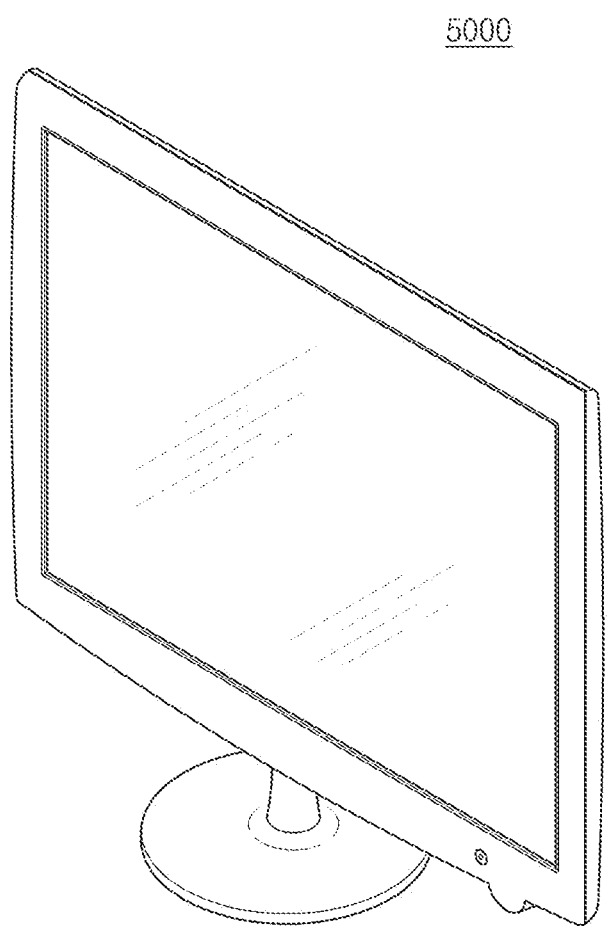
Figure 32:
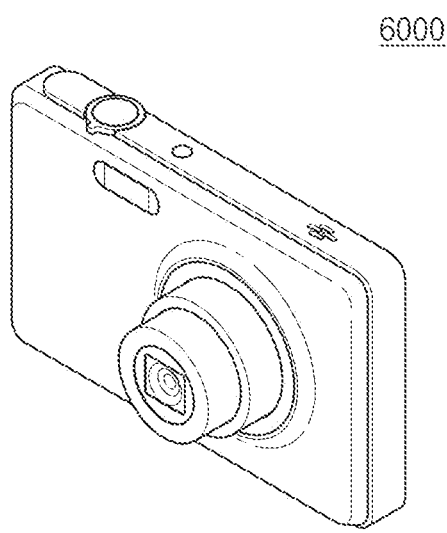

FIGS. 28 through 32 illustrate examples of multimedia devices, to which image sensors according to some embodiments of the inventive concept can be applied. Image sensors according to some embodiments of the inventive concept can be applied to a variety of multimedia devices with an imaging function. For example, image sensors according to example embodiments of the inventive concept may be applied to a mobile phone or a smart phone 2000 as illustrated in FIG. 28, to a tablet PC or a smart tablet PC 3000 as illustrated in FIG. 29, to a laptop computer 4000 as illustrated in FIG. 30, to a television or a smart television 5000 as illustrated in FIG. 31, and to a digital camera or a digital camcorder 6000 as illustrated in FIG. 32.

According to example embodiments of the present inventive concept, the image sensor may include the negative fixed charge layer which is adjacent to the sidewall and the bottom surface of the photoelectric conversion region. The negative fixed charge layer may have negative fixed charges such that the hole accumulation may occur around the negative fixed charge layer. Accordingly, it may be possible to effectively reduce the likelihood of the occurrence of dark current and white spot.

In some embodiments, the polysilicon pattern of the image sensor is disposed in the deep device isolation layer and has a coefficient of thermal expansion substantially similar to that of silicon composing the substrate. Accordingly, it may be possible to reduce physical stress generated from differences between thermal expansions of materials included in the image sensor.

In some embodiments, the air-gap of the image sensor is located in the deep device isolation layer. Therefore, cross-talk characteristics can be improved.

In some embodiments, the deep device isolation layer of the image sensor is disposed between the unit pixel regions to separate them from each other such that the occurrence of cross talk characteristics can be controlled. As a result, it may be possible to enhance color reproducibility properties.

Some embodiments provide processing steps in the fabrication of image sensors where the deep trench is formed using the preliminary device isolation layer as a sacrificial layer. Thus, it may be possible to reduce the likelihood, or possibly prevent, the positional misalignment of the deep trench. Consequently, it may be possible to improve the process yield and reduce the fabrication cost.

Although the present inventive concept has been described in connection with the embodiments of illustrated in the accompanying drawings, it is not limited thereto. It will be apparent to those skilled in the art that various substitution, modifications and changes may be thereto without departing from the scope and spirit of the inventive concept.

What is claimed is:

1. A method of fabricating an image sensor, the method comprising:
   providing a substrate defining a plurality of pixel regions and having a first surface and a second surface, opposite the first surface, wherein the second surface is configured to receive light incident thereon;
   forming a preliminary deep device isolation layer in the substrate to define the plurality of pixel regions;

in each of the pixel regions of the substrate, forming a photoelectric conversion region;

forming a transistor on the first surface of the substrate;

exposing the preliminary deep device isolation layer at the second surface of the substrate;

removing at least a portion of the preliminary deep device isolation layer to form a deep trench in the substrate; and forming a negative fixed charge layer covering the second surface and a sidewall of the deep trench.

2. The method of claim 1, after the forming of the negative fixed charge layer, forming a filling insulation layer on the second surface of the substrate.

3. The method of claim 2, wherein forming the filling insulation layer comprises forming the filling insulation layer extending inside of the deep trench to fill the deep trench.

4. The method of claim 2, after the forming of the filling insulation layer,
sequentially forming a color filter and a micro-lens on the second surface of the substrate in each of the pixel regions.

5. The method of claim 1, after the forming of the negative fixed charge layer, forming an air-gap region in the deep trench.

6. The method of claim 1, wherein forming the negative charge layer comprises depositing a metal oxide layer containing oxygen whose amount is less than the stoichiometric ratio.

7. The method of claim 6, wherein the metal oxide layer comprises at least one of hafnium (Hf), zirconium (Zr), aluminum (Al), tantalum (Ta), titanium (Ti), yttrium (Y), and lanthanide.

8. The method of claim 1, wherein forming the preliminary deep device isolation layer comprises:
etching the substrate to form a preliminary deep trench opened at the first surface of the substrate; and
filling the preliminary deep trench with the preliminary deep device isolation layer.

9. The method of claim 8, after the forming of the preliminary deep trench, forming an impurity doped region on the substrate adjacent to sidewalls and bottom of the preliminary deep trench.

10. The method of claim 1, before the exposing of the preliminary deep device isolation layer, forming a shallow device isolation layer on the first surface of the substrate,
wherein the shallow device isolation layer defines an active region in each of the pixel regions; and
wherein the negative fixed charge layer contacts the shallow device isolation layer.

11. The method of claim 1, before the exposing of the preliminary deep device isolation layer, forming a channel stop layer adjacent to the first surface of the substrate,
wherein the channel stop layer defines an active region in each of the pixel regions; and
wherein the negative fixed charge layer contacts the channel stop layer.

12. The method of claim 1, before the exposing of the preliminary deep device isolation layer,
forming a channel stop layer adjacent to the first surface of the substrate; and
forming an etch stop layer covering the first surface of the substrate,
wherein the channel stop layer defines an active region in each of the pixel regions; and
wherein the negative fixed charge layer contacts the channel stop layer and the etch stop layer.

13. The method of claim 1, wherein forming the transistor comprises forming a vertical transfer gate, the vertical transfer gate having a vertical shape which includes an extension part partially extending inside of the substrate.

14. A method of fabricating an image sensor, the method comprising:
providing a substrate defining a plurality of pixel regions and having a front surface and a backside surface opposite the front surface, wherein the backside surface is configured to receive light incident thereon;
patterning the front surface of the substrate to form a front deep trench in the substrate, the front deep trench being opened at the front surface of the substrate and defining the plurality of pixel regions;
forming a preliminary deep device isolation layer to fill the front deep trench;
forming a photoelectric conversion region in each of the pixel regions of the substrate;
forming a transistor on the front surface of the substrate;
exposing the preliminary deep device isolation layer at the backside surface of the substrate;
removing at least a portion of the preliminary deep device isolation layer to form a backside deep trench in the substrate, the backside deep trench being opened at the backside surface of the substrate and overlapping the front deep trench; and
forming a negative fixed charge layer covering the backside surface of the substrate and inner surfaces of the backside deep trench.

15. The method of claim 14, after the forming of the negative fixed charge layer, further comprising:
forming a filling insulation layer on the backside surface of the substrate to fill the backside deep trench; and
forming a color filter and a micro-lens on the filling insulation layer in each of the pixel regions,
wherein the filling insulation layer and the negative charge layer formed in the backside deep trench constitute a deep device isolation layer which separates the plurality of pixel regions from each other.

16. The method of claim 14, before the exposing of the preliminary deep device isolation layer, further comprising forming a shallow device isolation layer on the front surface of the substrate to define an active region in each of the pixel regions,
wherein the shallow device isolation layer overlaps the front deep trench.

17. The method of claim 14, before the exposing of the preliminary deep device isolation layer, further comprising forming a channel stop layer on the front surface of the substrate to define an active region in each of the pixel regions,
wherein the channel stop layer is doped with impurities having a different conductivity from the photoelectric conversion region.

18. The method of claim 14, before the forming of the preliminary deep device isolation layer, further comprising a plasma doping layer on inner surfaces of the front deep trench,
wherein the plasma doping layer is doped with impurities having a different conductivity from the photoelectric conversion region.

19. The method of claim 14, further comprising:
forming an inter-dielectric layer on the front surface of the substrate; and
forming a line layer in the inter-dielectric layer.

20. The method of claim 14, wherein forming the preliminary deep device isolation layer comprises:

sequentially forming an insulation liner an a polysilicon layer on the front surface of the substrate to fill the front deep trench; and planarizing the insulation layer and the polysilicon layer to form an insulation liner pattern and a polysilicon pattern in the front deep trench, wherein the insulation liner pattern and the polysilicon pattern constitute the preliminary deep device isolation layer.

21. The method of claim 20, wherein forming the backside deep trench comprises:

selectively removing the polysilicon pattern to expose a sidewall of the insulation liner pattern; and selectively removing the insulation liner pattern.

* * * * *